(12) United States Patent
Soda et al.

(10) Patent No.: US 10,741,478 B2
(45) Date of Patent: Aug. 11, 2020

(54) POWER MODULE AND METHOD OF MANUFACTURING THE SAME, AND POWER ELECTRONIC APPARATUS AND METHOD OF MANUFACTURING THE SAME

(71) Applicant: Mitsubishi Electric Corporation, Chiyoda-ku (JP)

(72) Inventors: Shinnosuke Soda, Chiyoda-ku (JP); Hiroshi Kobayashi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/079,638

(22) PCT Filed: Feb. 7, 2017

(86) PCT No.: PCT/JP2017/004372
§ 371 (c)(1),
(2) Date: Aug. 24, 2018

(87) PCT Pub. No.: WO2017/169134
PCT Pub. Date: Oct. 5, 2017

(65) Prior Publication Data
US 2019/0067165 A1    Feb. 28, 2019

(30) Foreign Application Priority Data

Mar. 30, 2016   (JP) ................. 2016-068786

(51) Int. Cl.
*H01L 23/48*     (2006.01)
*H01L 25/07*     (2006.01)
(Continued)

(52) U.S. Cl.
CPC ............ *H01L 23/481* (2013.01); *H01L 23/48* (2013.01); *H01L 23/495* (2013.01); *H01L 24/33* (2013.01);
(Continued)

(58) Field of Classification Search
CPC ...... H01L 23/495; H01L 23/481; H01L 24/33; H01L 25/18; H01L 23/48; H01L 25/07;
(Continued)

(56) References Cited

U.S. PATENT DOCUMENTS

2003/0213979 A1* 11/2003 Nakajima ............ H01L 23/427
257/200
2015/0061098 A1    3/2015 Imoto et al.

FOREIGN PATENT DOCUMENTS

JP    2008-42039 A    2/2008
JP    2014-236028 A    12/2014
(Continued)

OTHER PUBLICATIONS

International Search Report dated Apr. 11, 2017 in PCT/JP2017/004372 filed Feb. 7, 2017.

*Primary Examiner* — Thanh Y. Tran

(74) *Attorney, Agent, or Firm* — Oblon, McClelland, Maier & Neustadt, L.L.P.

(57) ABSTRACT

A power module includes a first power semiconductor device including a first electrode, a resin frame including first receiving portions, and a first leadframe. The first leadframe has a first main surface facing the first electrode and is electrically and mechanically connected to the first electrode. The first receiving portions face the first main surface of the first leadframe and receive part of the first leadframe. Thus, the power module has high reliability and can be miniaturized.

18 Claims, 23 Drawing Sheets

(51) Int. Cl.
  *H01L 25/18* (2006.01)
  *H01L 23/495* (2006.01)
  *H01L 23/00* (2006.01)
(52) U.S. Cl.
  CPC .............. *H01L 25/07* (2013.01); *H01L 25/18* (2013.01); *H01L 2224/33* (2013.01); *H01L 2224/40225* (2013.01); *H01L 2924/181* (2013.01)
(58) Field of Classification Search
  CPC ....... H01L 2224/33; H01L 2224/40225; H01L 2924/181
  See application file for complete search history.

(56) References Cited

FOREIGN PATENT DOCUMENTS

| | | |
|---|---|---|
| JP | 2015-46416 A | 3/2015 |
| JP | 2015-76562 A | 4/2015 |

* cited by examiner

POWER MODULE AND METHOD OF MANUFACTURING THE SAME, AND POWER ELECTRONIC APPARATUS AND METHOD OF MANUFACTURING THE SAME

TECHNICAL FIELD

The present invention relates to a power module and a method of manufacturing the same, and to a power electronic apparatus and a method of manufacturing the same.

BACKGROUND ART

Power modules are used, for example, in inverters that control the motors of electric vehicles, hybrid cars, or railway vehicles, or in converters for power generation and regeneration (see PTD 1). In the power module described in PTD 1, a leadframe is electrically connected to a power semiconductor device via a metal ribbon and a metal wire.

CITATION LIST

Patent Document

PTD 1: Japanese Patent Laying-Open No. 2015-76562

SUMMARY OF INVENTION

Technical Problem

The power module described in PTD 1 includes a metal ribbon and a metal wire. The power module described in PTD 1 accordingly does not have, for example, sufficiently high reliability in a heat cycle test. The power module described in PTD 1 requires the use of a ribbon bonder for wiring of the metal ribbon at an accurate position and requires the use of a wire bonder for wiring of the metal wire at an accurate position. The power module described in PTD 1 requires a space for receiving jigs such as the ribbon bonder and the wire bonder. The miniaturization of the power module described in PTD 1 is thus difficult.

The present invention has been made in view of the above problem, and has an object to provide a power module and a power electronic apparatus that have sufficiently high reliability and can be miniaturized.

Solution to Problem

A power module of the present invention includes a first substrate, a first power semiconductor device, a resin frame, a first leadframe, and a second leadframe. The first substrate includes a first conductive portion. The first power semiconductor device includes a first electrode and a second electrode that is electrically and mechanically connected to the first conductive portion. The resin frame is arranged on the first substrate so as to surround the first power semiconductor device. The first leadframe is electrically and mechanically connected to the first electrode. The first leadframe includes a first main surface facing the first electrode of the first power semiconductor device and a first lateral surface intersecting the first main surface and extending in the longitudinal direction of the first leadframe. The second leadframe is electrically and mechanically connected to the first conductive portion. The resin frame includes at least one first receiving portion facing the first main surface of the first leadframe. The at least one first receiving portion receives part of the first leadframe.

A method of manufacturing a power module of the present invention includes arranging a first power semiconductor device and a resin frame on a first substrate including a first conductive portion. The first power semiconductor device includes a first electrode and a second electrode. The resin frame surrounds the first power semiconductor device and includes at least one first receiving portion. Arranging of the first power semiconductor device on the first substrate includes electrically and mechanically connecting the second electrode of the first power semiconductor device to the first conductive portion. The method of manufacturing a power module of the present invention includes positioning a first leadframe with respect to the at least one first receiving portion such that the at least one first receiving portion receives part of the first leadframe, the at least one first receiving portion faces the first main surface of the first leadframe, and the first main surface faces the first electrode. The method of manufacturing a power module of the present invention includes electrically and mechanically connecting the first leadframe to the first electrode. The method of manufacturing a power module of the present invention includes electrically and mechanically connecting a second leadframe to the first conductive portion.

A power electronic apparatus of the present invention includes the power module and a case accommodating the power module. The case includes a first bus bar and a second bus bar. The first bus bar and the second bus bar are electrically and mechanically connected to the first leadframe and the second leadframe, respectively.

A method of manufacturing a power electronic apparatus of the present invention includes arranging a first power semiconductor device and a resin frame on a first substrate including a first conductive portion. The first power semiconductor device includes a first electrode and a second electrode. The resin frame surrounds the first power semiconductor device and includes at least one first receiving portion. Arranging of the first power semiconductor device on the first substrate includes electrically and mechanically connecting a second electrode of the first power semiconductor device to the first conductive portion. The method of manufacturing a power electronic apparatus of the present invention includes electrically and mechanically connecting a second leadframe to the first conductive portion. The method of manufacturing a power electronic apparatus of the present invention includes accommodating the first substrate in a case including a first bus bar, a second bus bar, and a third receiving portion. The method of manufacturing a power electronic apparatus of the present invention includes positioning the first leadframe with respect to the at least one first receiving portion and the third receiving portion such that the at least one first receiving portion and the third receiving portion receive part of the first leadframe, the at least one first receiving portion and the third receiving portion face a first main surface of the first leadframe, and the first main surface faces the first electrode. The method of manufacturing a power electronic apparatus of the present invention includes electrically and mechanically connecting the first leadframe to the first electrode. The method of manufacturing a power electronic apparatus of the present invention includes electrically and mechanically connecting the first leadframe to the first bus bar. The method of manufacturing a power electronic apparatus of the present invention includes electrically and mechanically connecting a second leadframe to the second bus bar.

Advantageous Effects of Invention

The power module of the present invention includes the first leadframe and the second leadframe, not a metal ribbon and a metal wire. The power module of the present invention thus has sufficiently high reliability. In the power module of the present invention, further, the first receiving portion receives part of the first leadframe, so that the first leadframe is positioned with respect to the resin frame and the first power semiconductor device. The power module of the present invention does not need to leave a space for receiving a jig for alignment of the first leadframe. The power module of the present invention can thus be miniaturized.

The method of manufacturing a power module of the present invention includes electrically and mechanically connecting the first leadframe to the first electrode, and electrically and mechanically connecting the second leadframe to the first conductive portion. The method of manufacturing a power module of the present invention can thus manufacture a power module having sufficiently high reliability. Further, the method of manufacturing a power module of the present invention includes positioning the first leadframe with respect to the first receiving portion such that the first receiving portion receives part of the first leadframe, the first receiving portion faces the first main surface of the first leadframe, and the first main surface faces the first electrode. The method of manufacturing a power module of the present invention does not need to leave a space for receiving a jig for alignment of the first leadframe. The method of manufacturing a power module of the present invention thus can manufacture a power module that can be miniaturized.

The power electronic apparatus of the present invention includes the power module described above. Thus, the power electronic apparatus of the present invention has sufficiently high reliability and can be miniaturized.

The method of manufacturing a power electronic apparatus of the present invention includes electrically and mechanically connecting the first leadframe to the first bus bar, and electrically and mechanically connecting the second leadframe to the second bus bar. The method of manufacturing a power electronic apparatus of the present invention thus can manufacture a power electronic apparatus having sufficiently high reliability. The method of manufacturing a power electronic apparatus of the present invention further includes positioning the first leadframe with respect to the first receiving portion and the third receiving portion such that the first receiving portion and the third receiving portion receive part of the first leadframe, the first receiving portion and the third receiving portion face the first main surface of the first leadframe, and the first main surface faces the first electrode. The method of manufacturing a power electronic apparatus of the present invention does not need to leave a space for receiving a jig for alignment of the first leadframe. The method of manufacturing a power electronic apparatus of the present invention thus can manufacture a power electronic apparatus that can be miniaturized.

DESCRIPTION OF EMBODIMENTS

Figure 1:
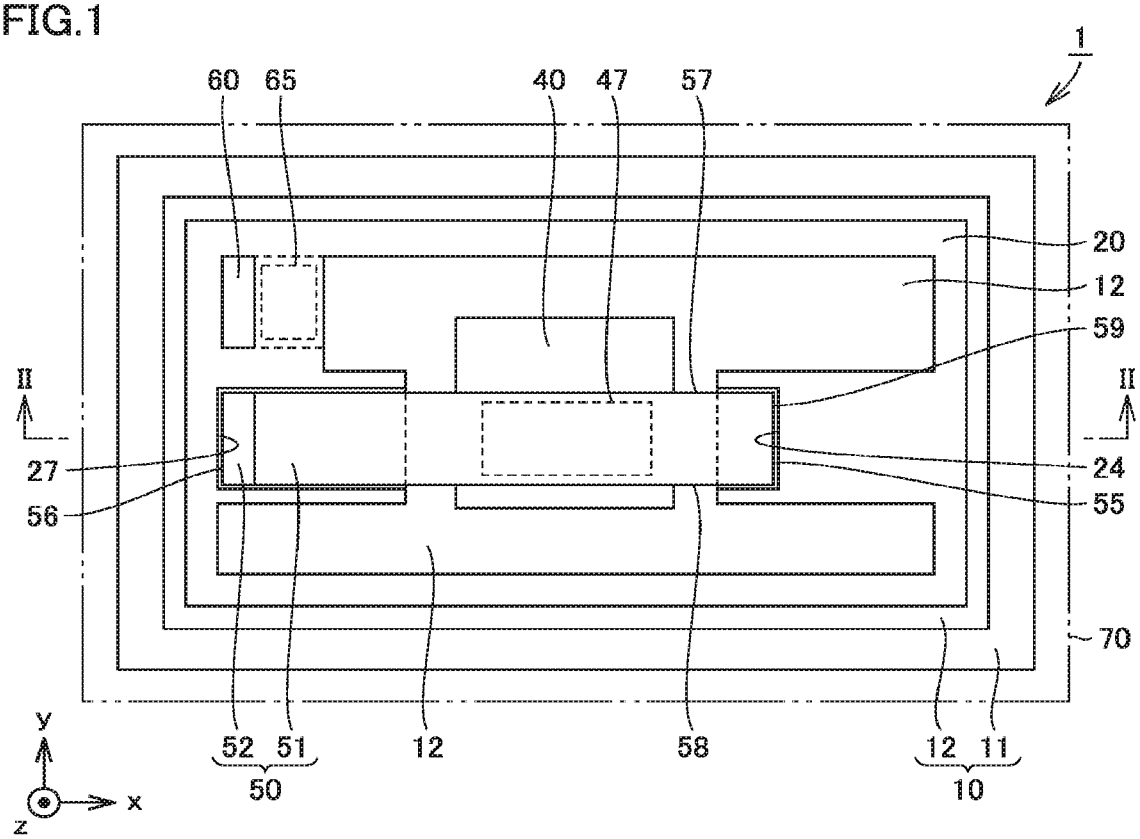
FIG. 1 is a schematic plan view of a power module according to Embodiment 1 of the present invention.

Embodiments of the present invention will be described below. The same or corresponding components will be denoted by the same reference numerals, and a description thereof will not be repeated.

Embodiment 1

Figure 2:
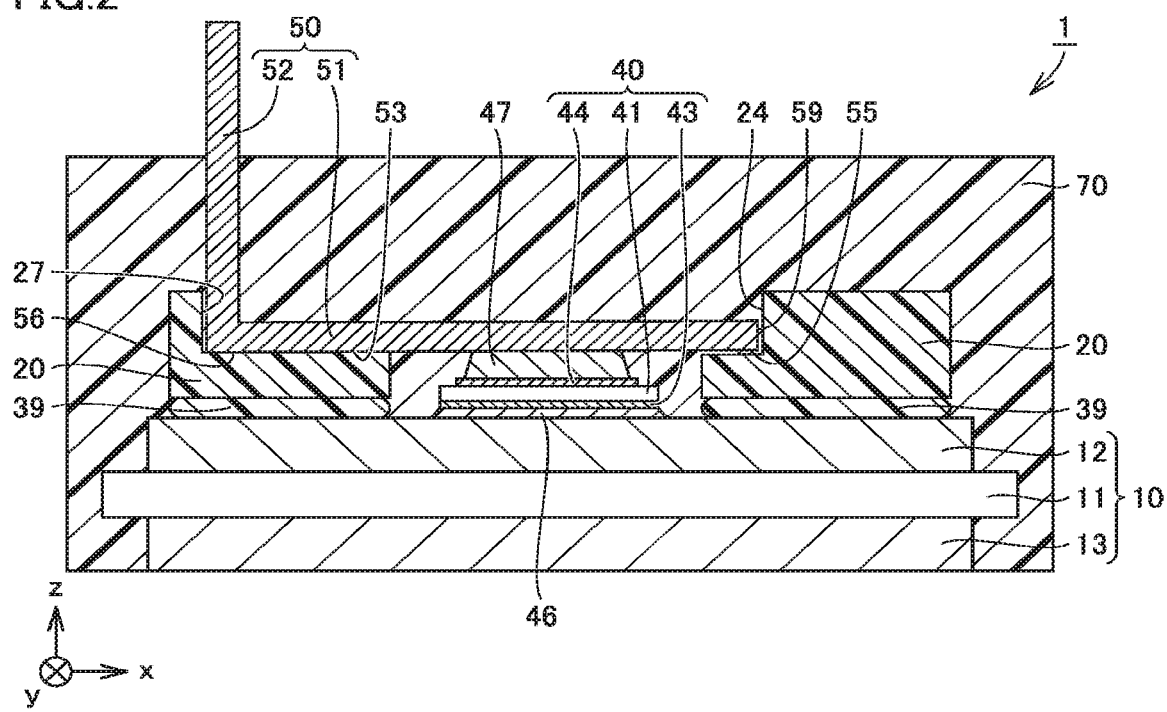
FIG. 2 is a schematic sectional view of the power module according to Embodiment 1 of the present invention, which is taken along the section line II-II shown in FIG. 1.

With reference to FIGS. 1 and 2, a power module 1 according to Embodiment 1 will be described. Power module 1 of the present embodiment mainly includes a first substrate 10, a resin frame 20, a first power semiconductor device 40, a first leadframe 50, and a second leadframe 60. Power module 1 of the present embodiment may further include a sealing resin body 70.

First substrate 10 includes a first insulating plate 11, a first conductive portion 12 on the front surface of first insulating plate 11, and a conductive portion 13 on the rear surface of first insulating plate 11. First substrate 10 may extend in a first direction (x direction) and a second direction (y direction) orthogonal to the first direction (x direction). First insulating plate 11 may be made of, for example, ceramic such as alumina, aluminum nitride, or silicon nitride, or resin having high thermal conductivity. First conductive portion 12 and conductive portion 13 may be made of a metal such as copper or aluminum. To prevent warpage of first substrate 10, first conductive portion 12 and conductive portion 13 may have substantially symmetric shapes about first insulating plate 11. To prevent erosion of first conductive portion 12 by a solder 46 and oxidation of first conductive portion 12 and conductive portion 13, nickel layers may be applied to the surfaces of first conductive portion 12 and conductive portion 13.

First power semiconductor device 40 may be, for example, a semiconductor switching element such as an insulated gate bipolar transistor (IGBT) or a metal-oxide-semiconductor field effect transistor (MOSFET), or may be a freewheeling diode (FWD). First power semiconductor device 40 may be made of a semiconductor material such as silicon, silicon carbide, or gallium nitride. First power semiconductor device 40 includes a first electrode 44 and a second electrode 43. Second electrode 43 is electrically and mechanically connected to first conductive portion 12 by solder 46. Solder 46 may be a lead-free solder such as Sn—Ag—Cu solder. Second electrode 43 may be electrically and mechanically connected to first conductive portion 12 with a liquid phase diffusion bonding layer containing low-melting metal or any other conductive bonding member such as silver paste.

First leadframe 50 is a main path for a large current flowing toward first power semiconductor device 40. First leadframe 50 may be made of a material having high electric conductivity and high thermal conductivity, such as copper or aluminum. To prevent erosion of first leadframe 50 by a conductive bonding member 47 such as solder and oxidation of first leadframe 50, a nickel layer may be applied to the surface of first leadframe 50.

First leadframe 50 may include a first leadframe portion 51 facing first substrate 10 and a second leadframe portion 52 extending so as to intersect first leadframe portion 51. First leadframe portion 51 may extend in the first direction (x direction) and the second direction (y direction) orthogonal to the first direction (x direction). Second leadframe portion 52 may extend in the second direction (y direction) and a third direction (z direction) orthogonal to the first direction (x direction) and the second direction (y direction). First leadframe 50 has a first main surface 53 facing first electrode 44. Particularly, first leadframe portion 51 has first main surface 53 facing first electrode 44. First main surface 53 may extend in the first direction (x direction) and the second direction (y direction) orthogonal to the first direction (x direction).

First leadframe portion 51 has a first end 55 and a second end 56 opposite to first end 55. First end 55 and second end 56 may be opposite ends of first leadframe portion 51 in the first direction (x direction). Second leadframe portion 52 may be connected to first leadframe portion 51 at second end 56. First leadframe portion 51 has a first lateral surface 57 and a first lateral surface 58 opposite to first lateral surface 57. Each of first lateral surfaces 57 and 58 connects first end 55 and second end 56 to each other. First lateral surfaces 57 and 58 intersect first main surface 53. Particularly, first lateral surfaces 57 and 58 may be orthogonal to first main surface 53. First lateral surfaces 57 and 58 extend in the longitudinal direction of first leadframe 50 (first leadframe portion 51).

First leadframe 50 is electrically and mechanically connected to first electrode 44 of first power semiconductor device 40 by conductive bonding member 47. Particularly, first main surface 53 of first leadframe 50 is electrically and mechanically connected to first electrode 44 of first power semiconductor device 40 by conductive bonding member 47. First leadframe portion 51 is electrically and mechanically connected to first electrode 44 of first power semiconductor device 40 by conductive bonding member 47. Conductive bonding member 47 may be a lead-free solder such as Sn—Ag—Cu solder, a silver paste, or a liquid phase diffusion bonding layer containing low-melting metal. From the perspective of smoothing out variations in bonding strength, conductivity, and bonding thickness, conductive bonding member 47 is preferably a lead-free solder such as Sn—Ag—Cu solder.

With reference to FIG. 1, second leadframe 60 is electrically and mechanically connected to first conductive portion 12. Particularly, second leadframe 60 is electrically and mechanically connected to first conductive portion 12 by a conductive bonding member 65. Second leadframe 60 may be made of a material having high electric conductivity and high thermal conductivity, such as copper or aluminum. To prevent erosion of second leadframe 60 by conductive bonding member 65 such as solder and oxidation of second leadframe 60, a nickel layer may be applied to the surface of second leadframe 60. Conductive bonding member 65 may be a lead-free solder such as Sn—Ag—Cu solder, a silver paste, or a liquid phase diffusion bonding layer containing low-melting metal. From the perspective of smoothing out variations in bonding strength, conductivity, and bonding thickness, conductive bonding member 65 is preferably a lead-free solder such as Sn—Ag—Cu solder.

Resin frame 20 is arranged on first substrate 10 so as to surround first power semiconductor device 40. Particularly, resin frame 20 is arranged on first conductive portion 12 of first substrate 10. Resin frame 20 may be made of for example, a material having electrical insulating properties and having a heat resistant temperature of 125° C. or higher, such as epoxy resin, polyphenylene sulfide (PPS), polyether ether ketone (PEEK), or liquid crystalline polymer (LCP). Resin frame 20 may be fixedly bonded on first substrate 10 with an adhesive 39 having a heat resistant temperature of 250° C. or higher, such as silicon adhesive or epoxy adhesive.

Resin frame 20 includes one or more first receiving portions (24, 27) facing first main surface 53 of first leadframe 50. The first receiving portions (24, 27) may be first depressions 24 and 27 formed in resin frame 20. One or more first depressions 24 and 27 receive part of first leadframe 50. First leadframe 50 is not present inside resin frame 20 per se. Resin frame 20 per se includes no first leadframe 50. First leadframe 50 is not fixed directly to resin frame 20. First leadframe 50 may be in contact with one or more first depressions 24 and 27. Particularly, first leadframe 50 may be in contact with the bottom surfaces of one or more first depressions 24 and 27, that is, the surfaces of one or more first depressions 24 and 27 closest to first substrate 10. First leadframe 50 may be apart from one or more first depressions 24 and 27 or may be located above (in the +z direction) one or more first depressions 24 and 27. Particularly, first leadframe 50 may be apart from the bottom surfaces of one or more first depressions 24 and 27. One or more first depressions 24 and 27 may align first leadframe 50 in the third direction (z direction) orthogonal to first main surface 53.

Particularly, one or more first depressions 24 and 27 may receive one or more ends (first end 55, second end 56) of first leadframe 50. First depression 24 may receive first end 55 of first leadframe 50. First depression 27 may receive second end 56 of first leadframe 50. To electrically and mechanically connect first leadframe 50 to first power semiconductor device 40, one or more first depressions 24 and 27 may be configured such that first leadframe 50 does not collide with first power semiconductor device 40 when first leadframe 50 is moved from above (in the +z direction) first power semiconductor device 40 toward first power semiconductor device 40. For example, the distance between the bottom surfaces of one or more first depressions 24 and 27 and the front surface of first substrate 10 (the front surface of first conductive portion 12) may be greater than the distance between the front surface of second electrode 43 of first power semiconductor device 40 and the front surface of first substrate 10 (the front surface of first conductive portion 12).

With reference to FIG. 1, one or more first depressions 24 and 27 may further face first lateral surfaces 57 and 58 of first leadframe 50. Herein, one or more first depressions 24 and 27 facing first lateral surfaces 57 and 58 of first leadframe 50 means that one or more first depressions 24 and 27 face at least one of a pair of first lateral surfaces 57 and 58. One or more first depressions 24 and 27 can align first leadframe 50 in the second direction (y direction) that is the transverse direction of first leadframe 50. One or more first depressions 24 and 27 may further face the surface (e.g., second lateral surface 59) of first leadframe 50 which intersects first main surface 53 and first lateral surfaces 57 and 58. One or more first depressions 24 and 27 can align first leadframe 50 in the first direction (x direction) that is the longitudinal direction of first leadframe 50. One or more first depressions 24 and 27 may face at least one of first lateral surfaces 57 and 58 and the surface (e.g., second lateral surface 59) of first leadframe 50 which intersects first main surface 53 and first lateral surfaces 57 and 58.

Power module 1 of the present embodiment may be sealed with sealing resin body 70. Sealing resin body 70 has electrical insulating properties. Sealing resin body 70 may be made of, for example, epoxy resin. Sealing resin body 70 may be formed by transfer molding. Part of first leadframe 50 projects from sealing resin body 70. Part of second leadframe 60 projects from sealing resin body 70.

A method of manufacturing power module 1 of the present embodiment will be described with reference to FIGS. 1 to 8.

With reference to FIGS. 3 to 6, the method of manufacturing power module 1 of the present embodiment includes arranging first power semiconductor device 40 and resin frame 20 on first substrate 10. First power semiconductor device 40 includes first electrode 44 and second electrode 43. Resin frame 20 surrounds first power semiconductor device 40 and includes one or more first depressions 24 and 27.

Figure 3:
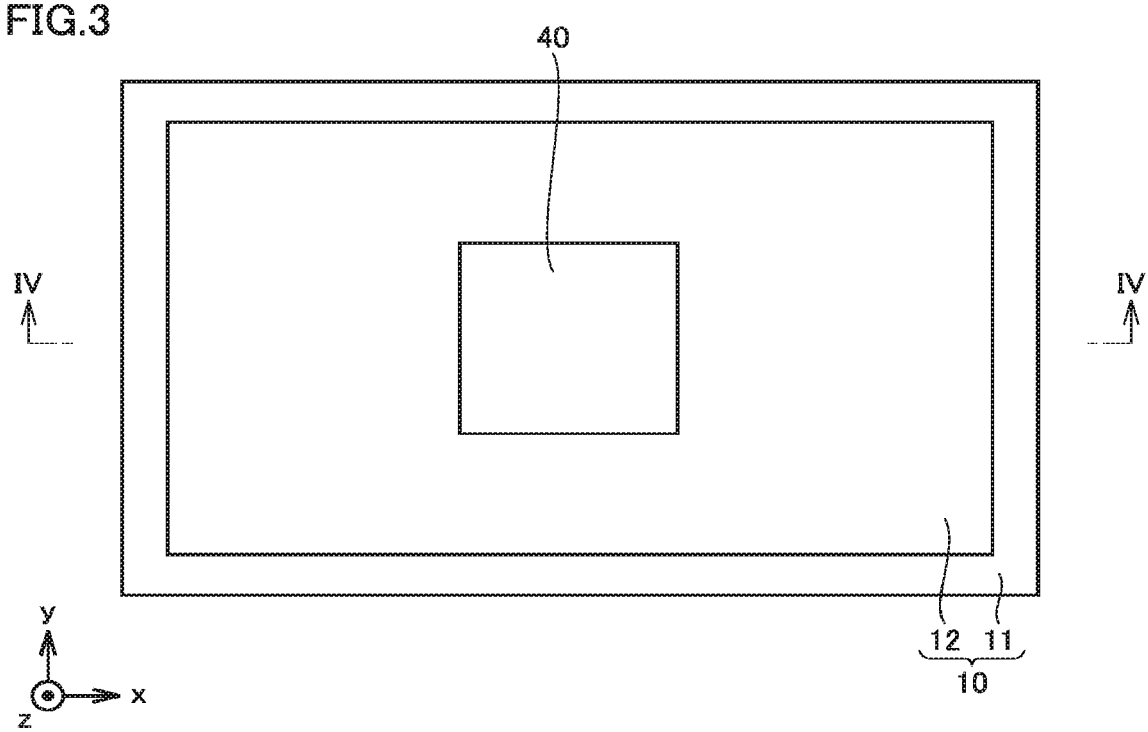
FIG. 3 is a schematic plan view showing one step of a method of manufacturing the power module according to Embodiment 1 of the present invention.
Figure 4:
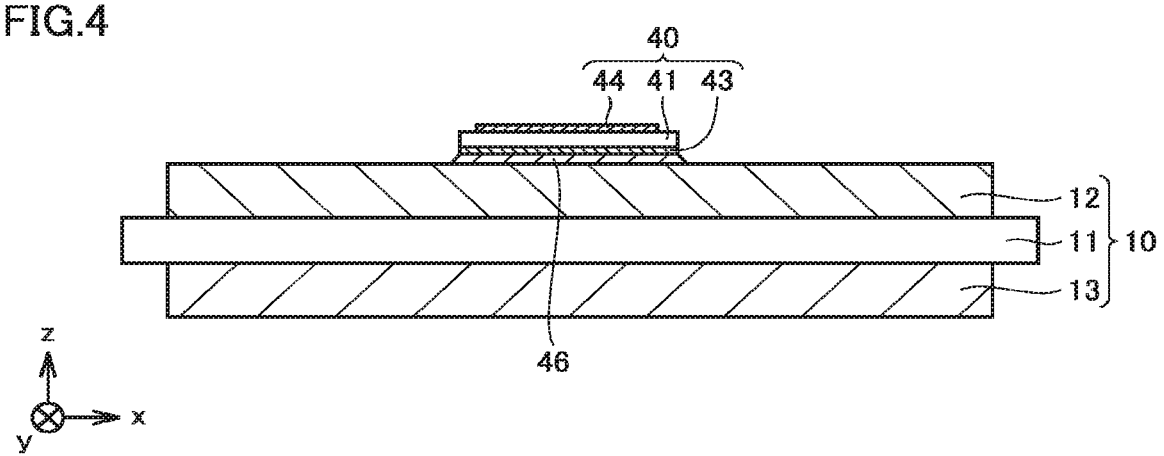
FIG. 4 is a schematic sectional view showing one step of the method of manufacturing the power module according to Embodiment 1 of the present invention, which is taken along the section line IV-IV shown in FIG. 3.

Particularly, as shown in FIGS. 3 and 4, first power semiconductor device 40 including first electrode 44 and second electrode 43 is arranged on first substrate 10. Second electrode 43 of first power semiconductor device 40 may be electrically and mechanically connected to first conductive portion 12 of first substrate 10 with solder 46 to bond first power semiconductor device 40 on first substrate 10.

Figure 5:
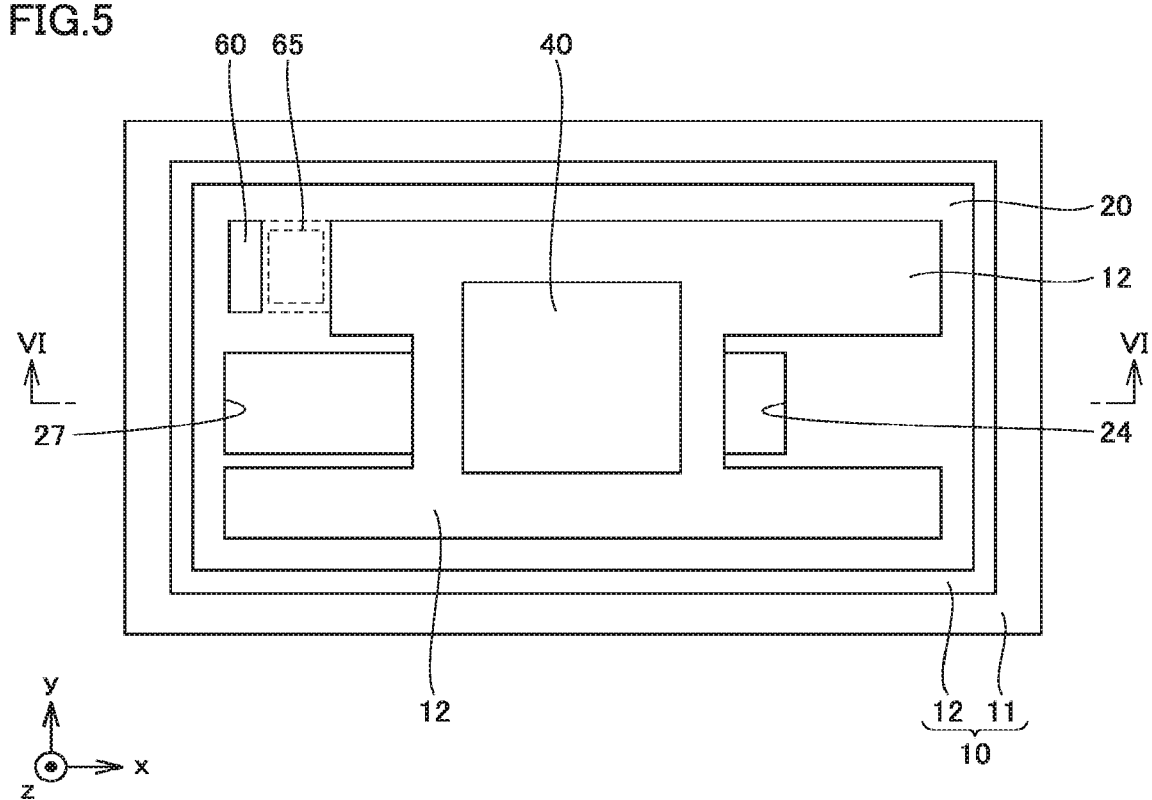
FIG. 5 is a schematic plan view showing a step following the step shown in FIG. 3 in the method of manufacturing the power module according to Embodiment 1 of the present invention.
Figure 6:
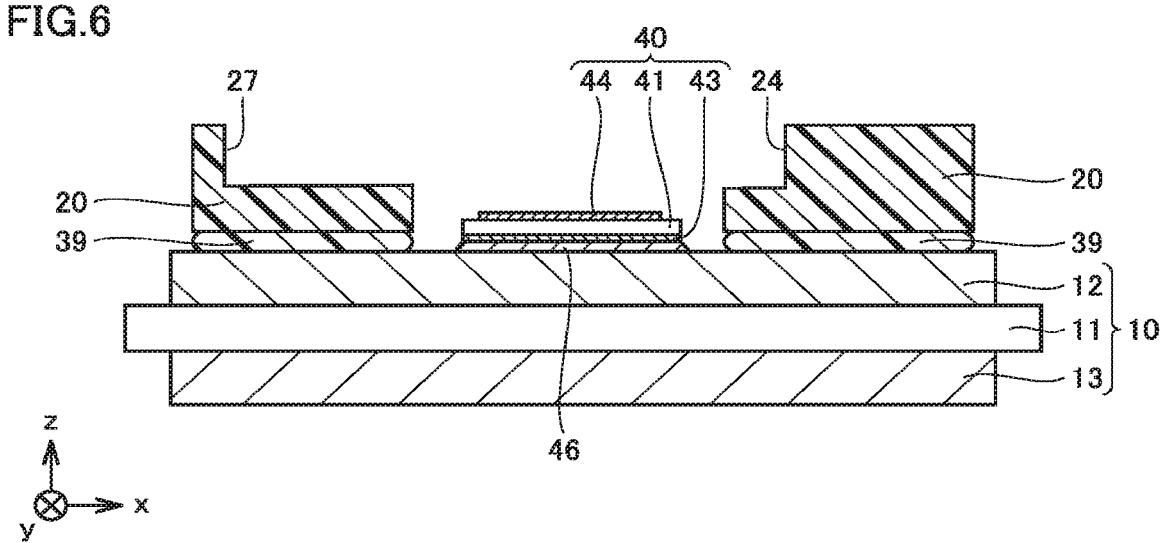
FIG. 6 is a schematic sectional view showing one step of the method of manufacturing the power module according to Embodiment 1 of the present invention, which is taken along the section line VI-VI shown in FIG. 5.

As shown in FIGS. 5 and 6, second leadframe 60 (not shown) may be electrically and mechanically connected to first conductive portion 12 with conductive bonding member 65 such as solder. Resin frame 20 may be fixedly bonded on first substrate 10 with adhesive 39. Part of second leadframe 60 may be integrated with resin frame 20.

Figure 7:
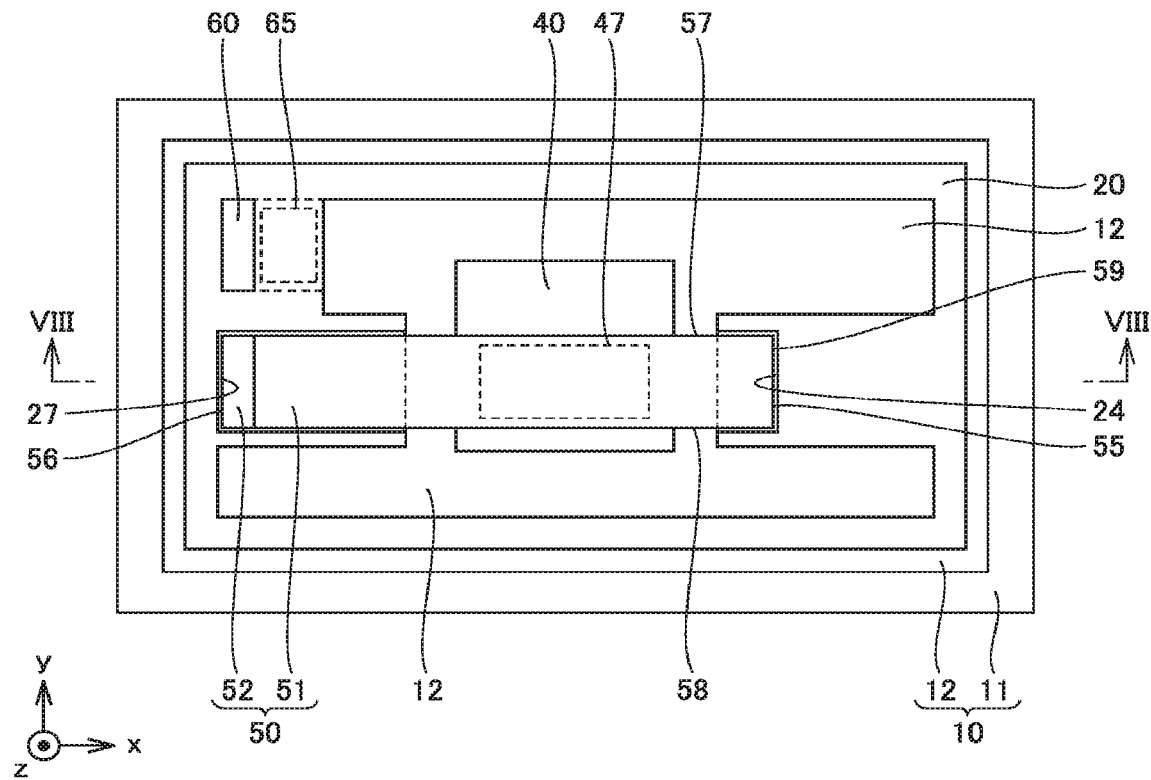
FIG. 7 is a schematic plan view showing a step following the step shown in FIG. 5 in the method of manufacturing the power module according to Embodiment 1 of the present invention.
Figure 8:
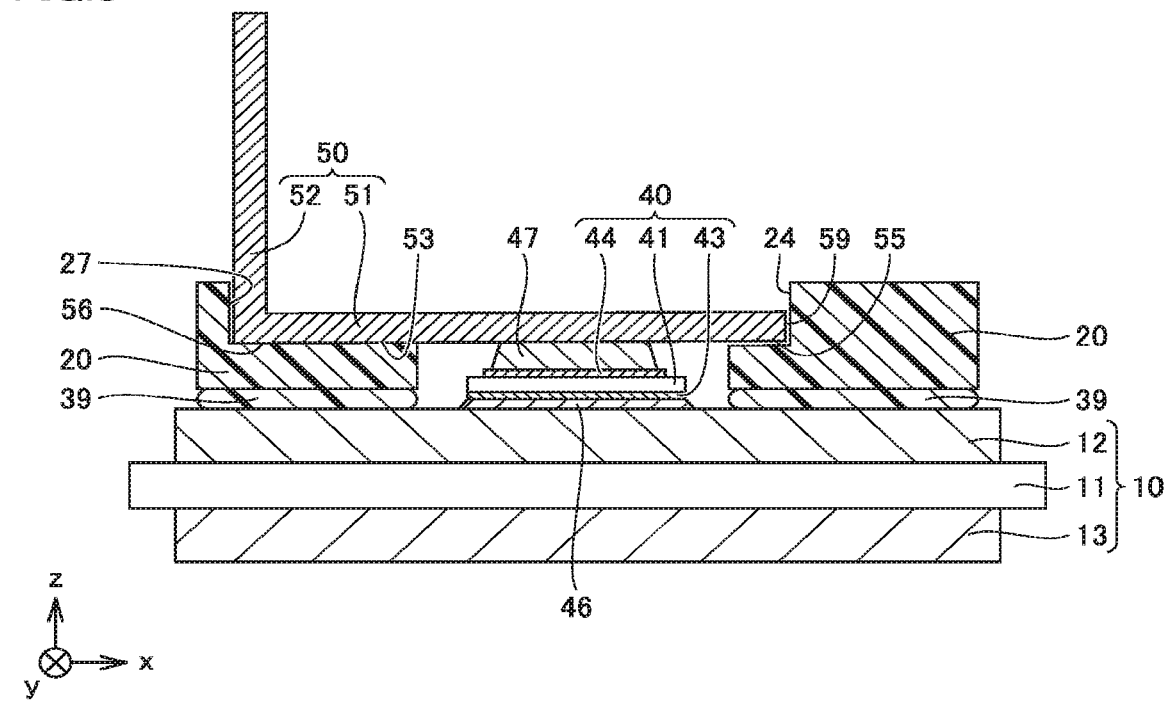
FIG. 8 is a schematic sectional view showing one step of the method of manufacturing the power module according to Embodiment 1 of the present invention, which is taken along the section line VIII-VIII shown in FIG. 7.

With reference to FIGS. 7 and 8, the method of manufacturing power module 1 of the present embodiment includes positioning first leadframe 50 with respect to one or more first depressions 24 and 27 such that one or more first depressions 24 and 27 receive part of first leadframe 50, first depressions 24 and 27 face first main surface 53 of first leadframe 50, and first main surface 53 faces first electrode 44. Particularly, one or more first depressions 24 and 27 may receive one or more ends (first end 55, second end 56) of first leadframe 50. One or more first depressions 24 and 27 can align first leadframe 50 in the third direction (z direction). More particularly, one or more first depressions 24 and 27 may face first lateral surfaces 57 and 58 of first leadframe 50. One or more first depressions 24 and 27 can align first leadframe 50 in the second direction (y direction). One or more first depressions 24 and 27 may further face the surface (e.g., second lateral surface 59) of first leadframe 50 which intersects first main surface 53 and first lateral surfaces 57 and 58. One or more first depressions 24 and 27 can align first leadframe 50 in the first direction (x direction).

With reference to FIGS. 7 and 8, the method of manufacturing power module 1 of the present embodiment further includes electrically and mechanically connecting first leadframe 50 to first electrode 44. Specifically, first leadframe 50 is electrically and mechanically connected to first electrode 44 with conductive bonding member 47 such as solder in a solder reflow step.

The effects of power module 1 of the present embodiment and the method of manufacturing the same will be described.

Power module 1 of the present embodiment includes first substrate 10, first power semiconductor device 40, resin frame 20, first leadframe 50, and second leadframe 60. First substrate 10 includes first conductive portion 12. First power semiconductor device 40 includes first electrode 44 and second electrode 43 that is electrically and mechanically connected to first conductive portion 12. Resin frame 20 is arranged on first substrate 10 so as to surround first power semiconductor device 40. First leadframe 50 is electrically and mechanically connected to first electrode 44. First leadframe 50 has first main surface 53 facing first electrode 44 of first power semiconductor device 40, and first lateral surfaces 57 and 58 intersecting first main surface 53 and extending in the longitudinal direction of first leadframe 50. Second leadframe 60 is electrically and mechanically connected to first conductive portion 12. Resin frame 20 includes one or more first receiving portions (24, 27) facing first main surface 53 of first leadframe 50. The first receiving portions (24, 27) receive part of first leadframe 50. The first receiving portions (24, 27) may be first depressions 24 and 27 formed in resin frame 20 facing first main surface 53.

Power module 1 of the present embodiment includes first leadframe 50 and second leadframe 60, not a metal ribbon and a metal wire, in order to cause a large current to flow through first power semiconductor device 40. Power module 1 of the present embodiment thus has, for example, sufficiently high reliability in a thermal cycle test. In addition, in power module 1 of the present embodiment, the first receiving portions (24, 27) receive part of first leadframe 50, so that first leadframe 50 is positioned with respect to resin frame 20 and first power semiconductor device 40. Power module 1 of the present embodiment does not need to leave a space for receiving a jig for alignment of first leadframe 50. Power module 1 of the present embodiment can thus be miniaturized.

In power module 1 of the present embodiment, the first receiving portions (24, 27) receive part of first leadframe 50. First leadframe 50 is not fixed directly to resin frame 20. Power module 1 of the present embodiment can thus have an improved degree of flexibility in design of first leadframe 50.

In power module 1 of the present embodiment, the first receiving portions (24, 27) may receive one or more ends (first end 55, second end 56) of first leadframe 50. Thus, power module 1 of the present embodiment has sufficiently high reliability and can be miniaturized.

In power module 1 of the present embodiment, the first receiving portions (24, 27) may further face first lateral surfaces 57 and 58 of first leadframe 50. The first receiving portions (24, 27) can align first leadframe 50 in the direction normal to first lateral surfaces 57 and 58 of first leadframe 50, for example, the second direction (y direction). In power module 1 of the present embodiment, first leadframe 50 can be aligned with respect to resin frame 20 and first power semiconductor device 40 with higher accuracy.

The method of manufacturing power module 1 of the present embodiment includes arranging first power semiconductor device 40 including first electrode 44 and second electrode 43 and resin frame 20 surrounding first power semiconductor device 40 and including one or more first receiving portions (24, 27) on first substrate 10 including first conductive portion 12. The method of manufacturing power module 1 of the present embodiment includes positioning first leadframe 50 with respect to the first receiving portions (24, 27) such that the first receiving portions (24, 27) receive part of first leadframe 50, the first receiving portions (24, 27) face first main surface 53 of first leadframe 50, and first main surface 53 faces first electrode 44. The method of manufacturing power module 1 of the present embodiment includes electrically and mechanically connecting first leadframe 50 to first electrode 44. The method of manufacturing power module 1 of the present embodiment includes electrically and mechanically connecting second leadframe 60 to first conductive portion 12. Arranging of first power semiconductor device 40 on first substrate 10 includes electrically and mechanically connecting second electrode 43 of first power semiconductor device 40 to first conductive portion 12.

The method of manufacturing power module 1 of the present embodiment includes electrically and mechanically connecting first leadframe 50 to first electrode 44, and electrically and mechanically connecting second leadframe 60 to first conductive portion 12. The method of manufacturing power module 1 of the present embodiment can manufacture power module 1 having, for example, sufficiently high reliability in a thermal cycle test. Further, the method of manufacturing power module 1 of the present embodiment includes positioning first leadframe 50 with respect to the first receiving portions (24, 27) such that the first receiving portions (24, 27) receive part of first leadframe 50, the first receiving portions (24, 27) face first main surface 53 of first leadframe 50, and first main surface 53 faces first electrode 44. The method of manufacturing power module 1 of the present embodiment does not need to leave a space for receiving a jig for alignment of first leadframe 50. The method of manufacturing power module 1 of the present embodiment can manufacture power module 1 that can be miniaturized.

The method of manufacturing power module 1 of the present embodiment can easily and reliably bond first leadframe 50 to first electrode 44 of first power semiconductor device 40 by the first receiving portions (24, 27). The method of manufacturing power module 1 of the present embodiment provides improved productivity.

The method of manufacturing power module 1 of the present embodiment includes positioning first leadframe 50 with respect to the first receiving portions (24, 27) such that the first receiving portions (24, 27) receive part of first leadframe 50. First leadframe 50 is not fixed directly to resin frame 20. The method of manufacturing power module 1 of the present embodiment can thus provide an improved degree of flexibility in design of first leadframe 50.

A modification of the present embodiment will be described. In the modification of the present embodiment, resin frame 20 may further include a first receiving portion that receives second leadframe 60. The power module of the modification of the present embodiment does not need to leave a space for receiving a jig for alignment of second leadframe 60. The power module of the modification of the present embodiment can thus manufacture a power module that can be miniaturized further.

Embodiment 2

Figure 9:
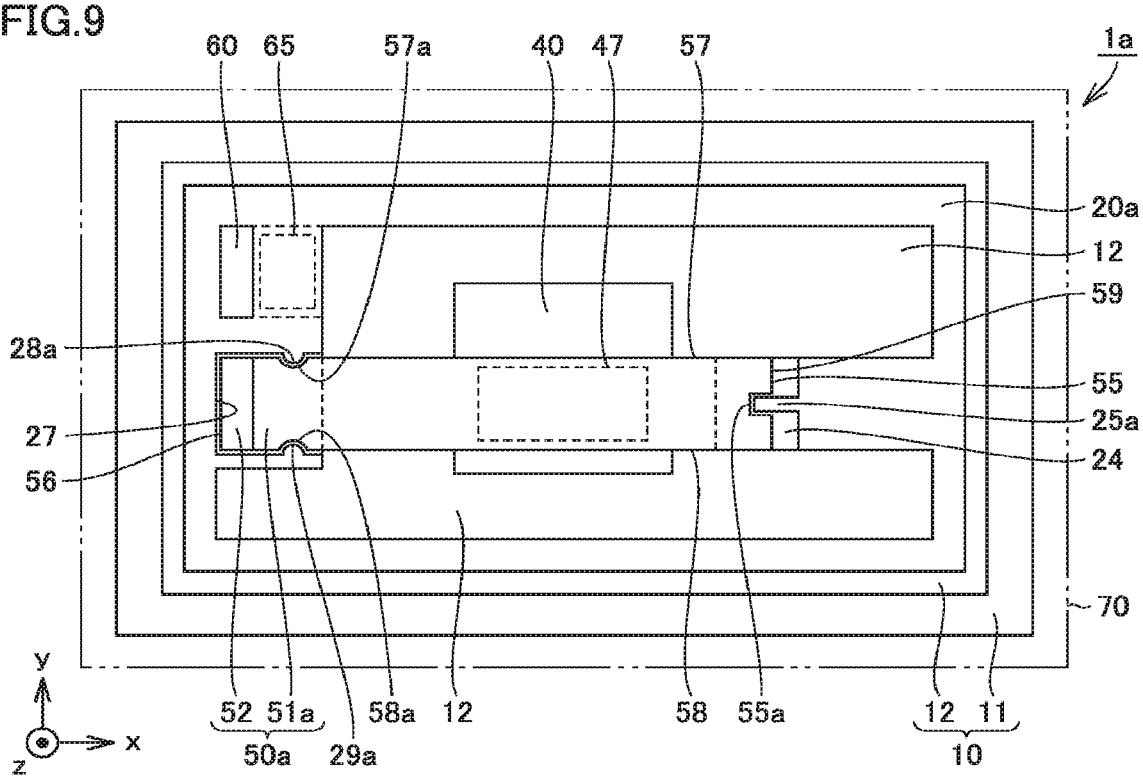
FIG. 9 is a schematic plan view of a power module according to Embodiment 2 of the present invention.

A power module 1a according to Embodiment 2 will be described with reference to FIG. 9. Power module 1a of the present embodiment basically has a configuration similar to that of power module 1 of Embodiment 1 but differs from power module 1 mainly in the following respects.

In power module 1a of the present embodiment, a first leadframe 50a includes one of one or more first projections 25a and one or more first recesses 55a at one or more ends (first end 55). Resin frame 20a includes the other of one or more first projections 25a and one or more first recesses 55a in first depression 24. One or more first projections 25a are fitted in one or more first recesses 55a. Herein, one or more first projections 25a being fitted in one or more first recesses 55a means that one or more first projections 25a are loosely fitted in one or more first recesses 55a.

Particularly, first end 55 of first leadframe 50a may include first recess 55a. First recess 55a may or may not pass through first leadframe 50a in the direction crossing first main surface 53 of first leadframe 50a, for example, the third direction (z direction). Resin frame 20a may include first projection 25a in first depression 24. Resin frame 20a may include a first projection 25a projecting in the first direction (x direction) that is the longitudinal direction of first leadframe 50a.

In power module 1a of the present embodiment, first leadframe 50a includes one of one or more second projections 28a and 29a and one or more second recesses 57a and 58a in first lateral surfaces 57 and 58 of first leadframe 50a. Resin frame 20a includes the other of one or more second projections 28a and 29a and one or more second recesses 57a and 58a in first depression 27. One or more second projections 28a and 29a are fitted in one or more second recesses 57a and 58a. Herein, one or more second projections 28a and 29a being fitted in one or more second recesses 57a and 58a means that one or more second projections 28a and 29a are loosely fitted in one or more second recesses 57a and 58a.

Particularly, first lateral surfaces 57 and 58 of first leadframe 50a may include second recesses 57a and 58a. More particularly, first lateral surface 57 of second end 56 of first leadframe 50a may include second recess 57a. First lateral surface 58 of second end 56 of first leadframe 50a may include a second recess 58a. Second recesses 57a and 58a may or may not pass through first leadframe 50a in the direction crossing first main surface 53 of first leadframe 50a, for example, the third direction (z direction). Resin frame 20a may include second projections 28a and 29a in first depression 27. Resin frame 20a may include second projections 28a and 29a projecting in the second direction (y direction) that is the transverse direction of first leadframe 50a.

The effects of power module 1a of the present embodiment will be described. Power module 1a of the present embodiment achieves the following effects in addition to the effects of power module 1 of Embodiment 1.

In power module 1a of the present embodiment, first leadframe 50a includes one of first projection 25a and first recesses 55a at one or more ends (first end 55). Resin frame 20a includes the other of first projection 25a and first recess 55a in the first receiving portion (24). First projection 25a is fitted in first recess 55a. First projection 25a and first recess 55a can align first leadframe 50a in, for example, the second direction (y direction) that is the transverse direction of first leadframe 50a. Power module 1a of the present embodiment can align first leadframe 50a with respect to resin frame 20a and first power semiconductor device 40 with higher accuracy.

In power module 1a of the present embodiment, first leadframe 50a includes one of second projections 28a and 29a and second recesses 57a and 58a in first lateral surfaces 57 and 58 of first leadframe 50a. Resin frame 20a includes the other of second projections 28a and 29a and second recesses 57a and 58a in the first receiving portion (27). Second projections 28a and 29a are fitted in second recesses 57a and 58a. Second projections 28a and 29a and second recesses 57a and 58a can align first leadframe 50a in, for example, the first direction (x direction) that is the longitudinal direction of first leadframe 50a. Power module 1a of the present embodiment can align first leadframe 50a with respect to resin frame 20a and first power semiconductor device 40 with higher accuracy.

Embodiment 3

Figure 10:
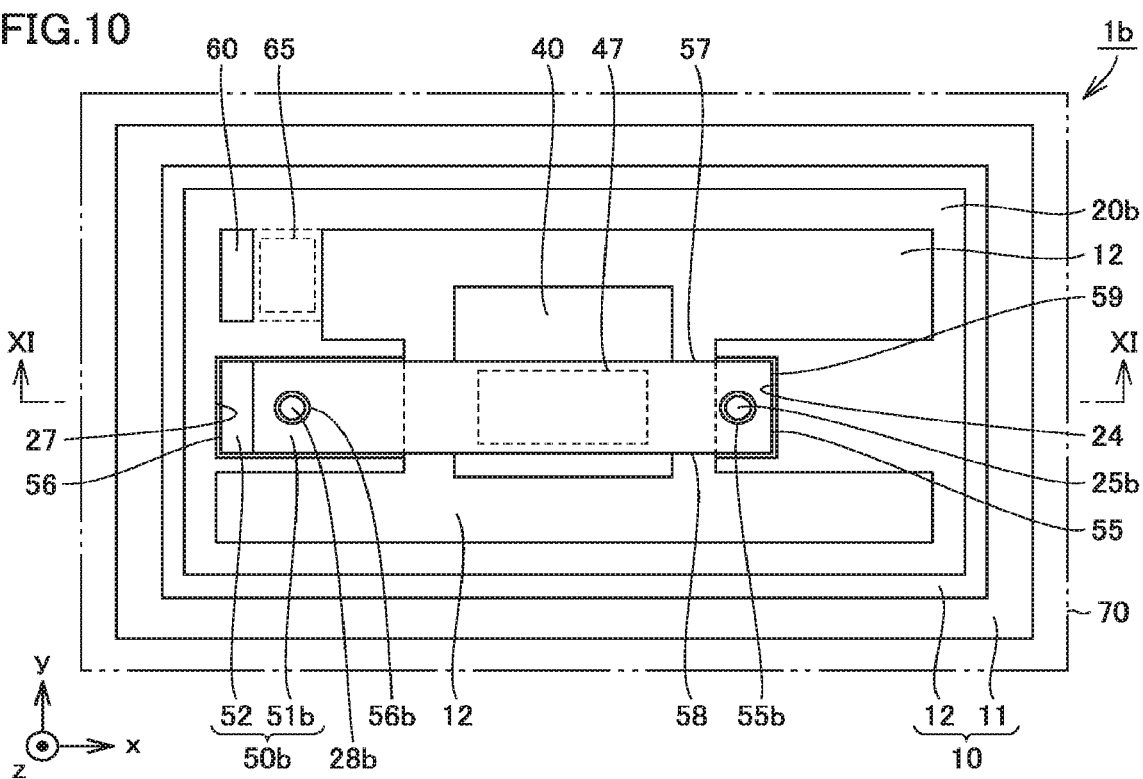
FIG. 10 is a schematic plan view of a power module according to Embodiment 3 of the present invention.
Figure 11:
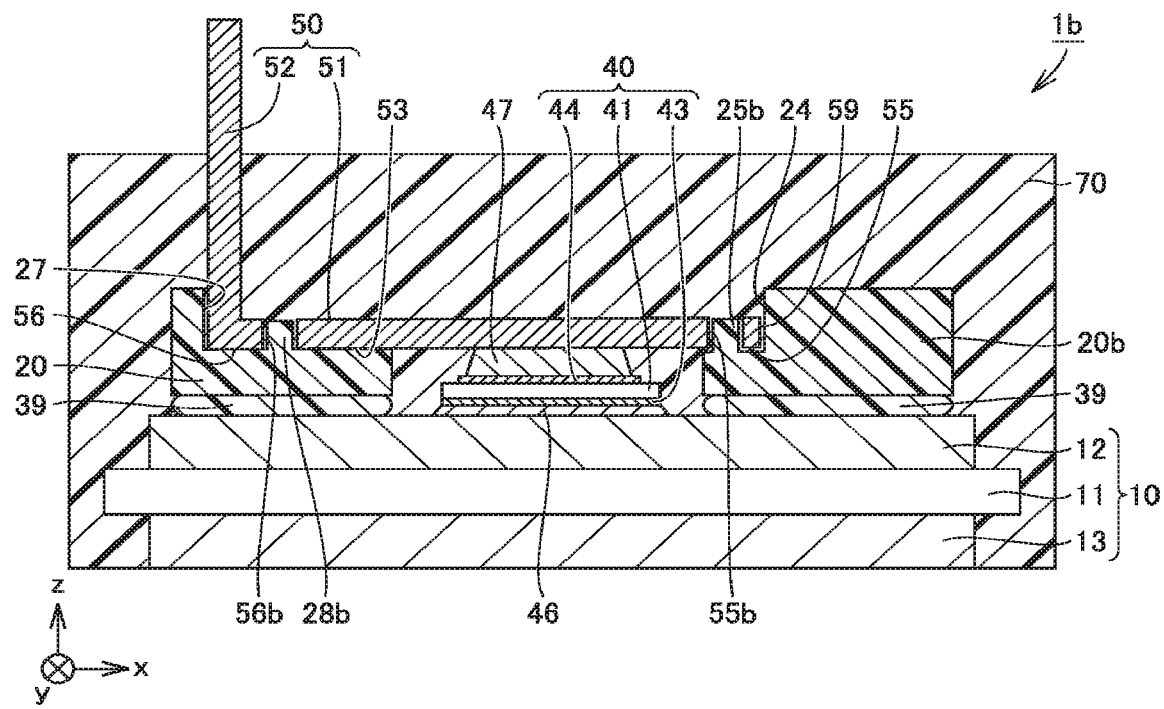
FIG. 11 is a schematic sectional view of the power module according to Embodiment 3 of the present invention, which is taken along the section line XI-XI shown in FIG. 10.

A power module 1b according to Embodiment 3 will be described with reference to FIGS. 10 and 11. Power module 1b of the present embodiment basically has a configuration similar to that of power module 1 of Embodiment 1 but differs from power module 1 mainly in the following respects.

In power module 1b of the present embodiment, a first leadframe 50b includes one of one or more third projections 25b and 28b and one or more first holes 55b and 56b in first main surface 53 of first leadframe 50b. Resin frame 20b includes the other of one or more third projections 25b and 28b and one or more first holes 55b and 56b in first depressions 24 and 27. One or more third projections 25b and 28b are fitted in one or more first holes 55b and 56b. Herein, one or more third projections 25b and 28b being fitted in one or more first holes 55b and 56b includes one or more third projections 25b and 28b being loosely fitted in one or more first holes 55b and 56b.

Particularly, first leadframe 50b may include first holes 55b and 56b in first main surface 53 of first leadframe 50b. More particularly, first main surface 53 of first end 55 of first leadframe 50b may include first hole 55b. First main surface 53 of second end 56 of first leadframe 50b may include first hole 56b. First holes 55b and 56b may or may not pass through first leadframe 50b in the direction crossing first main surface 53 of first leadframe 50b, for example, the third direction (z direction) that is the direction orthogonal to first main surface 53 of first leadframe Sob. Resin frame 20b may include third projections 25b and 28b in first depressions 24 and 27.

The effects of power module 1b of the present embodiment will be described. Power module 1b of the present embodiment achieves the following effects in addition to the effects of power module 1 of Embodiment 1. In power module 1b of the present embodiment, first leadframe 50b includes one of third projections 25b and 28b and first holes 55b and 56b in first main surface 53 of first leadframe 50b. Resin frame 20b includes the other of third projections 25b and 28b and first holes 55b and 56b in the first receiving portions (24, 27). Third projections 25b and 28b are fitted in first holes 55b and 56b. Third projections 25b and 28b and first holes 55b and 56b can align first leadframe 50b in the second direction (y direction) that is the transverse direction of first leadframe 50b and in the first direction (x direction) that is the longitudinal direction of first leadframe 50b.

Power module 1*b* of the present embodiment can align first leadframe 50*b* with respect to resin frame 20*b* and first power semiconductor device 40 with higher accuracy.

Embodiment 4

Figure 12:
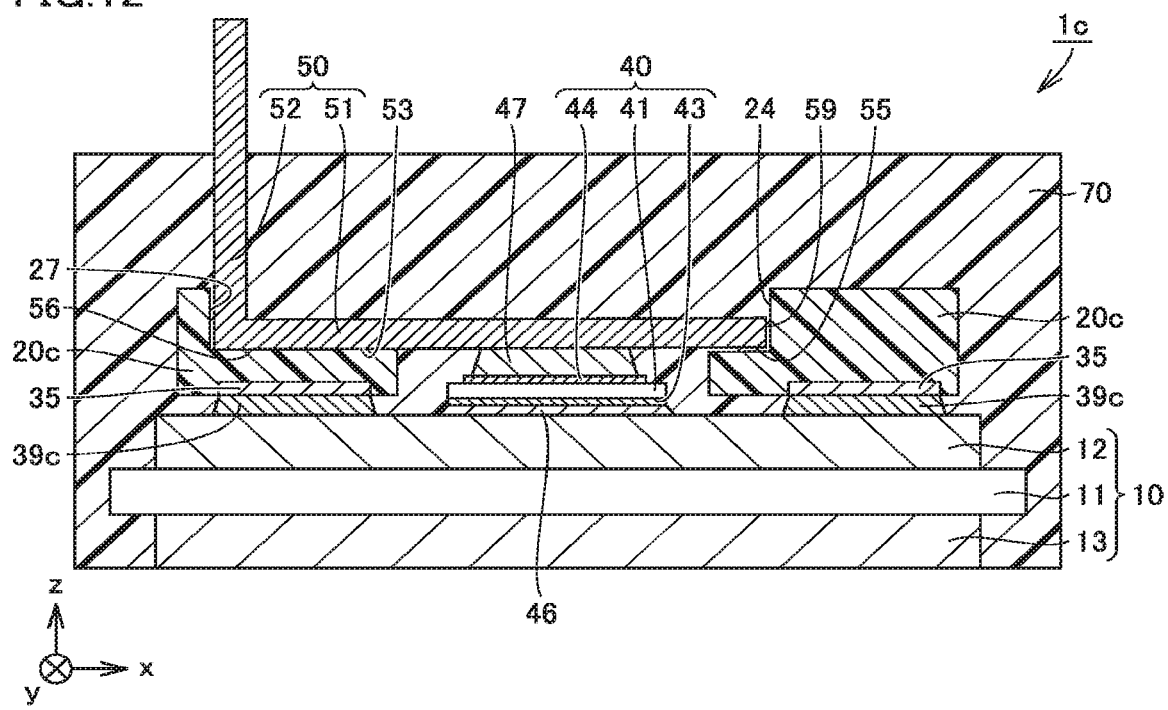
FIG. 12 is a schematic sectional view of a power module according to Embodiment 4 of the present invention.

A power module 1*c* according to Embodiment 4 will be described with reference to FIG. 12. Power module 1*c* of the present embodiment basically has a configuration similar to that of power module 1 of Embodiment 1 but differs from power module 1 mainly in the following respects.

In power module 1*c* of the present embodiment, a resin frame 20*c* further includes a metal film 35 arranged facing first substrate 10. Resin frame 20*c* is fixed to first substrate 10 via a solder 39*c* bonded to metal film 35. Particularly, resin frame 20*c* is fixed to first conductive portion 12 via solder 39*c* bonded to metal film 35. Metal film 35 is made of a metal capable of solder bonding, such as copper, nickel, gold, or silver.

A method of manufacturing power module 1*c* of the present embodiment will be described. The method of manufacturing power module 1*c* of the present embodiment basically includes steps similar to those of the method of manufacturing power module 1 of Embodiment 1 but differs from the method of Embodiment 1 mainly in the following respects.

The method of manufacturing power module 1*c* of the present embodiment includes disposing first power semiconductor device 40 and resin frame 20*c* on first substrate 10 via a preform of solder 46 and a preform of solder 39*c*. The method of manufacturing power module 1*c* of the present embodiment includes fixing first power semiconductor device 40 and resin frame 20*c* together to first substrate 10 with solders 39*c* and 46 by the solder reflow process. Consequently, first power semiconductor device 40 is electrically and mechanically connected to first conductive portion 12 via solder 46 bonded to second electrode 43. Resin frame 20*c* is mechanically connected to first substrate 10 via solder 39*c* bonded to metal film 35.

The effects of power module 1*c* of the present embodiment will be described. Power module 1*c* of the present embodiment achieves effects similar to those of power module 1 of Embodiment 1 but differs from power module 1 in the following respects. In power module 1*c* of the present embodiment, resin frame 20*c* further includes metal film 35 arranged facing first substrate 10. Resin frame 20*c* is fixed to first substrate 10 via solder 39*c* bonded to metal film 35. Solder 39*c* of the present embodiment has a softening temperature higher than the softening temperature of adhesive 39 of Embodiment 1. Power module 1*c* of the present embodiment operates stably also at higher temperatures and has higher reliability. Resin frame 20*c* and first power semiconductor device 40 can be fixed together to first substrate 10 with solders 39*c* and 46. Power module 1*c* of the present embodiment has such a structure as to reduce the cost and time for manufacturing power module 1*c*.

The effects of the method of manufacturing power module 1*c* of the present embodiment will be described. Power module 1*c* of the present embodiment achieves the following effects in addition to the effects of the method of manufacturing power module 1 of Embodiment 1. The method of manufacturing power module 1*c* of the present embodiment can fix first power semiconductor device 40 and resin frame 20*c* together to first substrate 10 with solders 39*c* and 46. The method of manufacturing power module 1*c* of the present embodiment can reduce the cost and time for manufacturing power module 1*c*.

Embodiment 5

Figure 13:
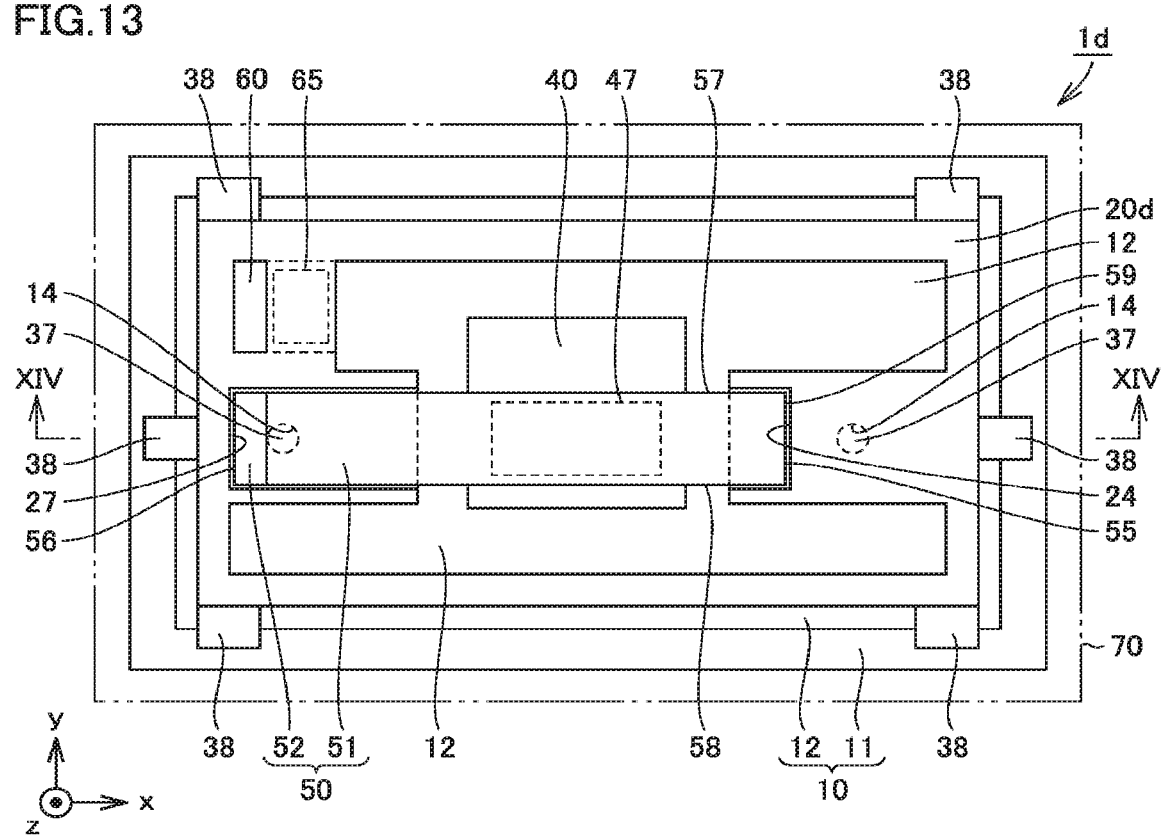
FIG. 13 is a schematic plan view of a power module according to Embodiment 5 of the present invention.
Figure 14:
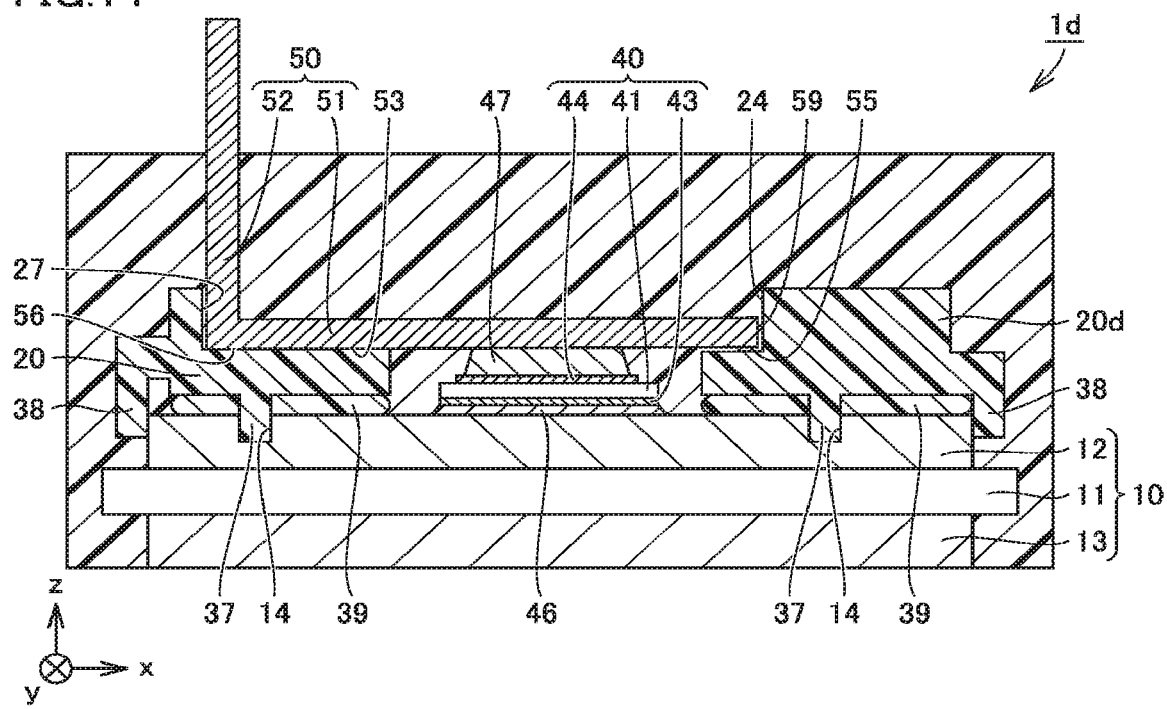
FIG. 14 is a schematic sectional view of the power module according to Embodiment 5 of the present invention, which is taken along the section line XIV-XIV shown in FIG. 13.

A power module 1*d* according to Embodiment 5 will be described with reference to FIGS. 13 and 14. Power module 1*d* of the present embodiment basically has a configuration similar to that of power module 1 of Embodiment 1 but differs from power module 1 mainly in the following respects.

In power module 1*d* of the present embodiment, a resin frame 20*d* includes one of one or more fourth projections 37 and one or more second holes 14. First substrate 10 includes the other of one or more fourth projections 37 and one or more second holes 14. Particularly, first conductive portion 12 includes the other of one or more fourth projections 37 and one or more second holes 14. One or more fourth projections 37 are fitted in one or more second holes 14.

In power module 1*d* of the present embodiment, resin frame 20*d* includes one or more locking portions 38. One or more locking portions 38 may be nail portions or protrusions. One or more locking portions 38 may project from resin frame 20*d* toward first substrate 10. One or more locking portions 38 may be made of the same material as that for resin frame 20*d* and may be integrated with resin frame 20*d*. One or more locking portions 38 may be locked with first substrate 10. Particularly, one or more locking portions 38 may be locked with first conductive portion 12.

The effects of power module 1*d* of the present embodiment will be described. Power module 1*d* of the present embodiment achieves the following effects in addition to the effects of power module 1 of Embodiment 1.

In power module 1*d* of the present embodiment, first substrate 10 includes one of fourth projection 37 and second hole 14. The resin frame includes the other of fourth projection 37 and second hole 14. Fourth projection 37 is fitted in second hole 14. In power module 1*d* of the present embodiment, fourth projection 37 and second hole 14 can accurately align resin frame 20*d* with respect to first substrate 10.

In power module 1*d* of the present embodiment, resin frame 20*d* includes one or more locking portions 38. One or more locking portions 38 are locked with first substrate 10. In power module 1*d* of the present embodiment, one or more locking portions 38 can accurately align resin frame 20*d* with respect to first substrate 10. In addition, resin frame 20*d* is mechanically connected to first substrate 10 by adhesive 39, as well as by one or more locking portions 38. Power module 1*d* of the present embodiment can have an improved mechanical connection strength between resin frame 20*d* and first substrate 10.

Embodiment 6

A power module 2 according to Embodiment 6 will be described with reference to FIGS. 15 and 16. Power module 2 of the present embodiment basically has a configuration similar to that of power module 1 of Embodiment 1 but differs from power module 1 mainly in the following respects.

Power module 2 of the present embodiment further includes a second substrate 110. Second substrate 110 is arranged at an interval from first substrate 10 in, for example, the first direction (x direction). Second substrate 110 includes a second insulating plate 111, a second conductive portion 112 on the front surface of second insulating plate 111, and a conductive portion 113 on the rear surface of second insulating plate 111. Second substrate 110 may extend in the first direction (x direction) and the second direction (y direction) orthogonal to the first direction (x direction). Second insulating plate 111 may be made of, for example, ceramic such as alumina, aluminum nitride, or silicon nitride, or resin having high thermal conductivity. Second conductive portion 112 is electrically isolated from first conductive portion 12. Conductive portion 113 is electrically isolated from conductive portion 13. Second conductive portion 112 and conductive portion 113 may be made of a metal such as copper or aluminum. To prevent warpage of second substrate 110, second conductive portion 112 and conductive portion 113 may have substantially symmetric shapes about second insulating plate 111. To prevent erosion of second conductive portion 112 by a solder 146 and oxidation of second conductive portion 112 and conductive portion 113, nickel layers may be applied to the surfaces of second conductive portion 112 and conductive portion 113. Second substrate 110 may have the same configuration as that of first substrate 10.

Power module 2 of the present embodiment further includes a second power semiconductor device 140. Second power semiconductor device 140 may be, for example, a semiconductor switching element such as an insulated gate bipolar transistor (IGBT) or a metal-oxide-semiconductor field effect transistor (MOSFET), or may be a freewheeling diode (FWD). Second power semiconductor device 140 may be made of a semiconductor material such as silicon, silicon carbide, or gallium nitride. Second power semiconductor device 140 includes a third electrode 144 and a fourth electrode 143. Fourth electrode 143 is electrically and mechanically connected to second conductive portion 112 with solder 146. Solder 146 may be a lead-free solder such as Sn—Ag—Cu solder. Fourth electrode 143 may be electrically and mechanically connected to second conductive portion 112 with a liquid phase diffusion bonding layer containing low-melting metal or any other conductive bonding member such as silver paste. First power semiconductor device 40 and second power semiconductor device 140 are electrically connected in anti-parallel with each other.

A first leadframe 50e of the present embodiment may include a first leadframe portion 51e facing first substrate 10 and a second leadframe portion 52 extending so as to intersect first leadframe portion 51e. First leadframe 50e may extend not only above first power semiconductor device 40 but also above second power semiconductor device 140. Particularly, first leadframe portion 51e may extend not only above first power semiconductor device 40 but also above second power semiconductor device 140. First leadframe 50e is electrically isolated from a third leadframe 150. First leadframe portion 51e may extend substantially parallel to third leadframe 150. Power module 2 of the present embodiment can thus have low inductance. In plan view from the direction normal to first main surface 53 of first leadframe 50e, first leadframe portion 51e may overlap third leadframe 150.

Power module 2 of the present embodiment further includes third leadframe 150. Third leadframe 150 is a main path for a large current flowing toward second power semiconductor device 140. Third leadframe 150 may be made of a material having high electric conductivity and high thermal conductivity, such as copper or aluminum. To prevent erosion of third leadframe 150 by a conductive bonding member 147 such as solder and oxidation of third leadframe 150, a nickel layer may be applied to the surface of third leadframe 150.

Third leadframe 150 may extend in the first direction (x direction) and the second direction (y direction) orthogonal to the first direction (x direction). Third leadframe 150 has a second main surface 153 facing third electrode 144. Second main surface 153 may extend in the first direction (x direction) and the second direction (y direction) orthogonal to the first direction (x direction).

Third leadframe 150 has a third end 155 and a fourth end 156 opposite to third end 155. Third end 155 and fourth end 156 may be opposite ends of third leadframe 150 in the first direction (x direction). Third leadframe 150 has a third lateral surface 157 and a third lateral surface 158 opposite to third lateral surface 157. Each of third lateral surfaces 157 and 158 connects third end 155 and fourth end 156 to each other. Third lateral surfaces 157 and 158 intersect second main surface 153. Particularly, third lateral surfaces 157 and 158 may be orthogonal to second main surface 153. Third lateral surfaces 157 and 158 extend in the longitudinal direction of third leadframe 150.

Third leadframe 150 is electrically and mechanically connected to third electrode 144 of second power semiconductor device 140 with conductive bonding member 147. Particularly, second main surface 153 of third leadframe 150 is electrically and mechanically connected to third electrode 144 of second power semiconductor device 140 with conductive bonding member 147. Third leadframe 150 may be electrically and mechanically connected to first conductive portion 12 with a conductive bonding member 162 such as solder. Particularly, third end 155 of third leadframe 150 may be electrically and mechanically connected to first conductive portion 12 with conductive bonding member 162. Conductive bonding member 162 may be arranged in a third recess 30 of a resin frame 20e. Conductive bonding members 147 and 162 may be lead-free solders such as Sn—Ag—Cu solder, a silver paste, or a liquid phase diffusion bonding layer containing low-melting metal. From the perspective of smoothing out variations in bonding strength, conductivity, and bonding thickness, conductive bonding members 147 and 162 are preferably lead-free solders such as Sn—Ag—Cu solder.

Figure 15:
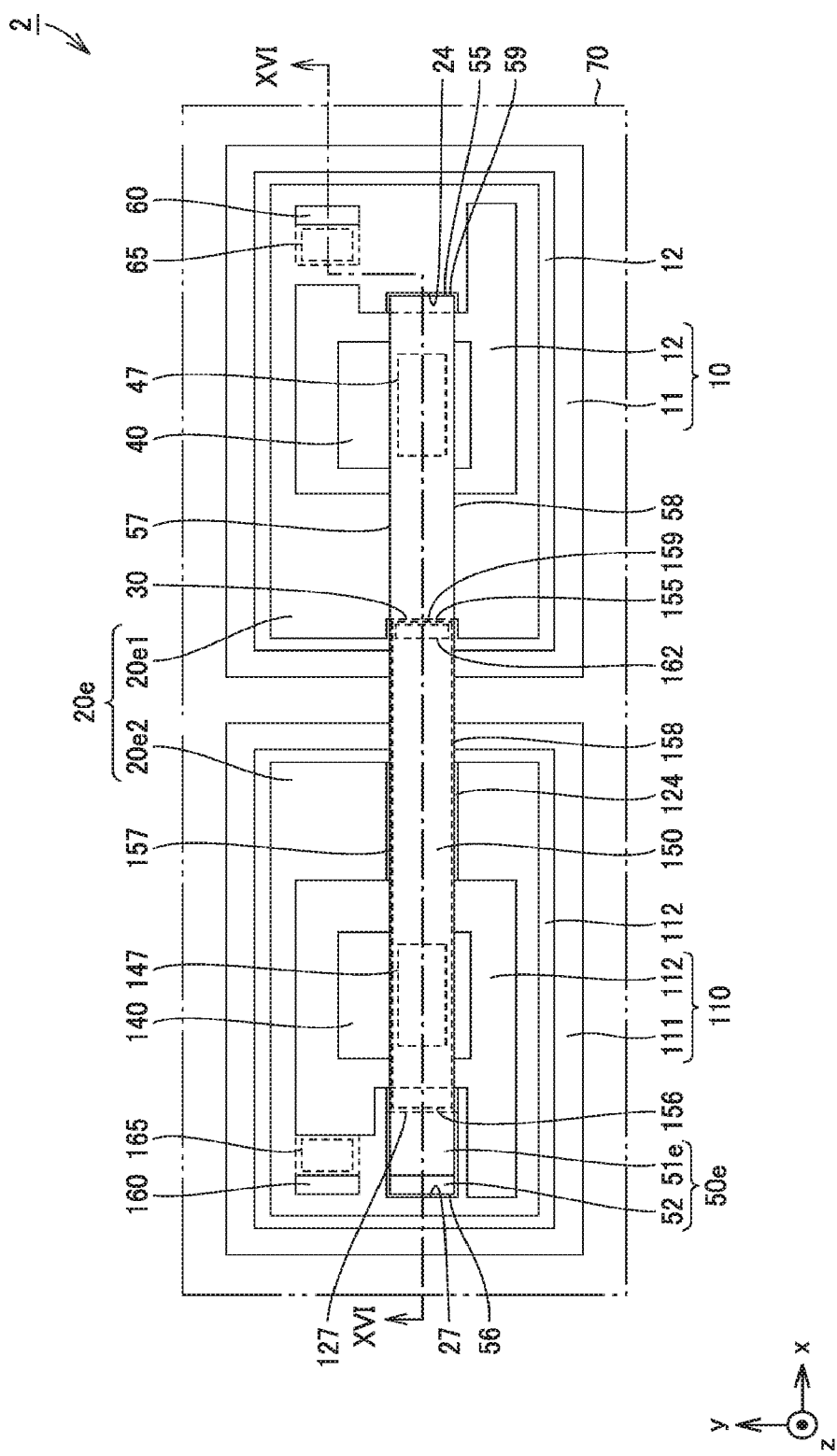
FIG. 15 is a schematic plan view of a power module according to Embodiment 6 of the present invention.
Figure 16:
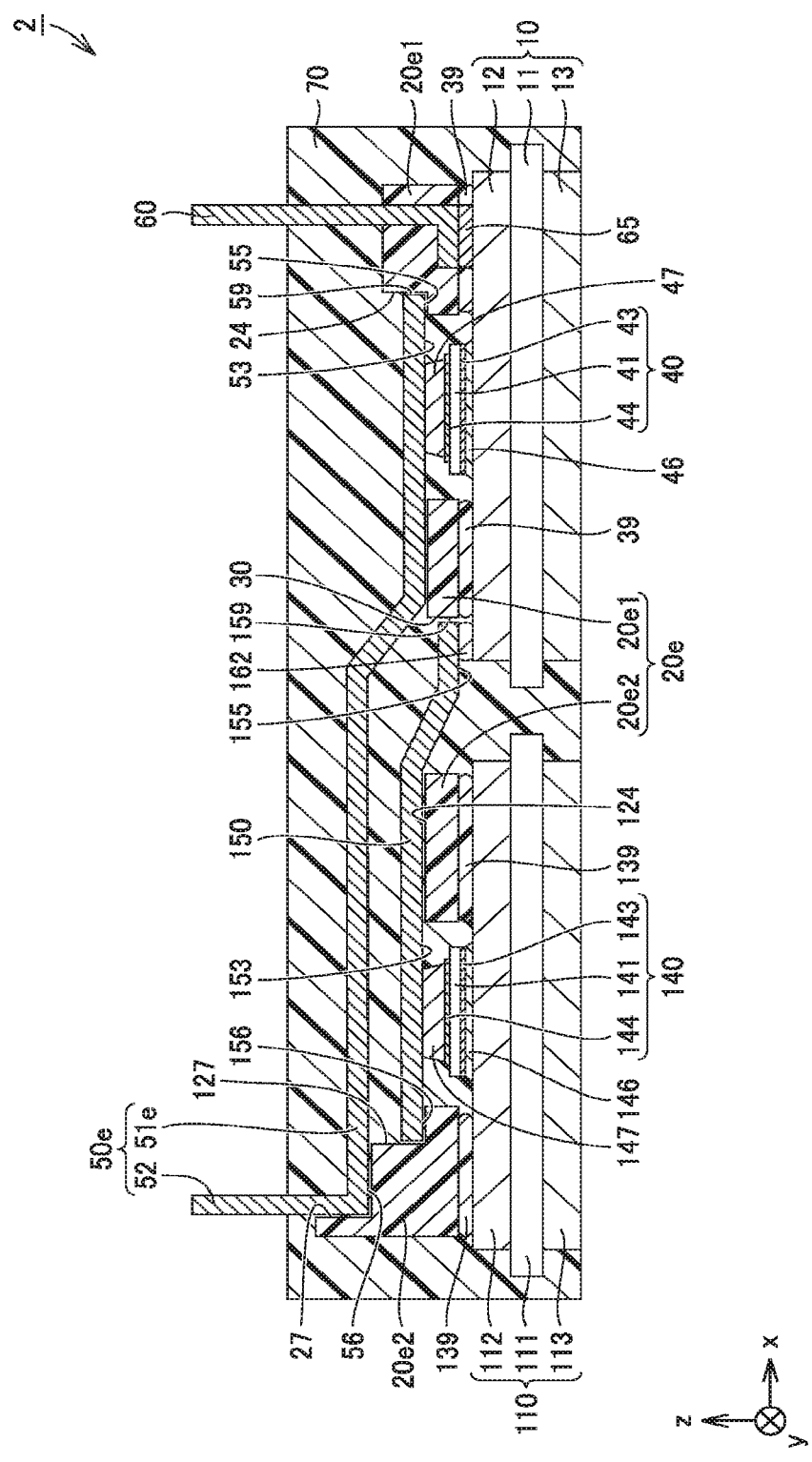
FIG. 16 is a schematic sectional view of the power module according to Embodiment 6 of the present invention, which is taken along the section line XVI-XVI shown in FIG. 15.

With reference to FIG. 15, power module 2 of the present embodiment may further include a fourth leadframe 160. Fourth leadframe 160 is electrically and mechanically connected to second conductive portion 112 with a conductive bonding member 165. Fourth leadframe 160 may be made of a material having high electric conductivity and high thermal conductivity, such as copper or aluminum. To prevent erosion of fourth leadframe 160 by conductive bonding member 165 such as solder and oxidation of fourth leadframe 160, a nickel layer may be applied to the surface of fourth leadframe 160. Conductive bonding member 165 may be a lead-free solder such as Sn—Ag—Cu solder, a silver paste, or a liquid phase diffusion bonding layer containing low-melting metal. From the perspective of smoothing out variations in bonding strength, conductivity, and bonding thickness, conductive bonding member 165 is preferably a lead-free solder such as Sn—Ag—Cu solder.

Resin frame 20e of the present embodiment includes a first resin frame portion 20e1 and a second resin frame portion 20e2. Resin frame 20e is arranged on first substrate 10 so as to surround first power semiconductor device 40. Particularly, first resin frame portion 20e1 is arranged on first substrate 10 so as to surround first power semiconductor device 40. Resin frame 20e is arranged on second substrate 110 so as to surround second power semiconductor device 140. Particularly, second resin frame portion 20e2 is arranged on second substrate 110 so as to surround second power semiconductor device 140. First resin frame portion 20e1 and second resin frame portion 20e2 may be made of, for example, a material having electrical insulating properties and a heat resistant temperature of 125° C. or higher, such as epoxy resin, polyphenylene sulfide (PPS), polyether ether ketone (PEEK), or liquid crystalline polymer (LCP). First resin frame portion 20e1 may be fixedly bonded on first substrate 10 with adhesive 39 having a heat resistant temperature of 250° C. or higher, such as silicon adhesive or epoxy adhesive. Second resin frame portion 20e2 may be fixedly bonded on second substrate 110 with an adhesive 139 having a heat resistant temperature of 250° C. or higher, such as silicon adhesive or epoxy adhesive. Adhesive 139 may be made of the same material as that for adhesive 39.

Resin frame 20e includes one or more first depressions 24 and 27 facing first main surface 53 of first leadframe 50e. One or more first depressions 24 and 27 receive part of first leadframe 50e. Particularly, first resin frame portion 20e1 includes a first depression 24 facing first main surface 53 of first leadframe 50e. Second resin frame portion 20e2 includes a first depression 27 facing first main surface 53 of first leadframe 50e. First leadframe 50e is not present inside resin frame 20e per se. Resin frame 20e per se includes no first leadframe 50e. First leadframe 50e is not fixed directly to resin frame 20e. First leadframe 50e may be in contact with one or more first depressions 24 and 27. First leadframe 50e may be apart from one or more first depressions 24 and 27 or may be located above (in the +z direction) one or more first depressions 24 and 27. One or more first depressions 24 and 27 can align first leadframe 50e in the third direction (z direction) orthogonal to first main surface 53.

Particularly, one or more first depressions 24 and 27 may receive one or more ends (first end 55, second end 56) of first leadframe 50e. First depression 24 may receive first end 55 of first leadframe 50e. First depression 27 may receive second end 56 of first leadframe 50e. To electrically and mechanically connect first leadframe 50e to first power semiconductor device 40, one or more first depressions 24 and 27 may be configured such that first leadframe 50e does not collide with first power semiconductor device 40 when first leadframe 50e is moved from above (in the +z direction) first power semiconductor device 40 toward first power semiconductor device 40.

With reference to FIG. 15, one or more first depressions 24 and 27 may further face first lateral surfaces 57 and 58 of first leadframe 50e. One or more first depressions 24 and 27 can align first leadframe 50e in the second direction (y direction) that is the transverse direction of first leadframe 50e. One or more first depressions 24 and 27 may further face the surface (second lateral surface 59) of first leadframe 50e intersecting first main surface 53 and first lateral surfaces 57 and 58. One or more first depressions 24 and 27 can align first leadframe 50e in the first direction (x direction) that is the longitudinal direction of first leadframe 50e.

Resin frame 20e includes one or more second receiving portions (124, 127) facing second main surface 153 of third leadframe 150. The second receiving portions (124, 127) may be second depressions 124 and 127 formed in resin frame 20e. One or more second depressions 124 and 127 receive part of third leadframe 150. Particularly, second resin frame portion 20e2 includes second depressions 124 and 127 facing second main surface 153 of third leadframe 150. Third leadframe 150 is not located inside resin frame 20e per se. Resin frame 20e per se includes no third leadframe 150. Third leadframe 150 is not fixed directly to resin frame 20e. Third leadframe 150 may be in contact with one or more second depressions 124 and 127. Third leadframe 150 may be apart from one or more second depressions 124 and 127, or may be located above (in the +z direction) of one or more second depressions 124 and 127. One or more second depressions 124 and 127 can align third leadframe 150 in the third direction (z direction) orthogonal to second main surface 153.

Particularly, one or more second depressions 124 and 127 may receive one or more ends (fourth end 156) of third leadframe 150. Second depression 127 may receive fourth end 156 of third leadframe 150. To electrically and mechanically connect third leadframe 150 to second power semiconductor device 140, one or more second depressions 124 and 127 may be configured such that third leadframe 150 does not collide with second power semiconductor device 140 when third leadframe 150 is moved from above (in the +z direction) second power semiconductor device 140 toward second power semiconductor device 140.

With reference to FIG. 15, one or more second depressions 124 and 127 may further face third lateral surfaces 157 and 158 of third leadframe 150. Herein, one or more second depressions 124 and 127 facing third lateral surfaces 157 and 158 of third leadframe 150 means that one or more second depressions 124 and 127 face at least one of a pair of third lateral surfaces 157 and 158. One or more second depressions 124 and 127 can align third leadframe 150 in the second direction (y direction) that is the transverse direction of third leadframe 150. Second depression 127 may further face the surface of third leadframe 150 which intersects second main surface 153 and third lateral surfaces 157 and 158. Second depression 127 can align third leadframe 150 in the first direction (x direction) that is the longitudinal direction of third leadframe 150. One or more second depressions 124 and 127 may face at least one of third lateral surfaces 157 and 158 and the surface of third leadframe 150 which intersects second main surface 153 and third lateral surfaces 157 and 158.

Resin frame 20e may include one or more third recesses 30 that receive part of third leadframe 150. Particularly, first resin frame portion 20e1 may include one or more third recesses 30 that receive part of third leadframe 150. First conductive portion 12 may be exposed from one or more third recesses 30. One or more third recesses 30 may receive one or more ends (third end 155) of third leadframe 150. One or more third recesses 30 may further face third lateral surfaces 157 and 158 of third leadframe 150. Herein, one or more third recesses 30 facing third lateral surfaces 157 and 158 of third leadframe 150 means that one or more third recesses 30 face at least one of a pair of third lateral surfaces 157 and 158. One or more third recesses 30 can align third leadframe 150 in the second direction (y direction) that is the transverse direction of third leadframe 150. One or more third recesses 30 may further face the surface (fourth lateral surface 159) of third leadframe 150 which intersects second main surface 153 and third lateral surfaces 157 and 158. One or more third recesses 30 can align third leadframe 150 in the first direction (x direction) that is the longitudinal direction of third leadframe 150. One or more third recesses 30 may face at least one of third lateral surfaces 157 and 158 and the surface (fourth lateral surface 159) of third leadframe 150 which intersects second main surface 153 and third lateral surfaces 157 and 158.

Power module 2 of the present embodiment may be sealed with sealing resin body 70. Sealing resin body 70 may be formed by transfer molding. Part of first leadframe 50e projects from sealing resin body 70. Part of second leadframe 60 projects from sealing resin body 70. Part of third leadframe 150 projects from sealing resin body 70. Part of fourth leadframe 160 projects from sealing resin body 70.

The effects of power module 2 of the present embodiment will be described. Power module 2 of the present embodiment achieves effects similar to those of power module 1 of Embodiment 1 but differs from power module 1 in the following respects.

Power module 2 of the present embodiment further includes second substrate 110, second power semiconductor device 140, third leadframe 150, and fourth leadframe 160. Second substrate 110 includes second conductive portion 112. Second power semiconductor device 140 includes third electrode 144 and fourth electrode 143 that is electrically and mechanically connected to second conductive portion 112. Third leadframe 150 has second main surface 153 facing third electrode 144 and is electrically and mechanically connected to third electrode 144. Fourth leadframe 160 is electrically and mechanically connected to second conductive portion 112. Fourth electrode 143 is electrically and mechanically connected to second conductive portion 112. Resin frame 20e is arranged on second substrate 110 so as to surround second power semiconductor device 140. Resin frame 20e further includes the second receiving portions (124, 127) facing second main surface 153 of third leadframe 150. The second receiving portions (124, 127) receive part of third leadframe 150.

To cause a large current to flow through second power semiconductor device 140, power module 2 of the present embodiment includes third leadframe 150 and fourth leadframe 160, not a metal ribbon and a metal wire. Power module 2 of the present embodiment thus has, for example, sufficiently high reliability in a thermal cycle test. Further, in power module 2 of the present embodiment, the second receiving portions (124, 127) receive part of third leadframe 150, so that third leadframe 150 is positioned with respect to resin frame 20e (second resin frame portion 20e2) and second power semiconductor device 140. Power module 2 of the present embodiment does not need to leave a space for receiving a jig for alignment of third leadframe 150. Power module 2 of the present embodiment can thus be miniaturized.

In power module 2 of the present embodiment, the second receiving portions (124, 127) receive part of third leadframe 150. Third leadframe 150 is not fixed directly to resin frame 20e (second resin frame portion 20e2). Power module 2 of the present embodiment can thus have an improved degree of flexibility in design of third leadframe 150.

In power module 2 of the present embodiment, the second receiving portion (124) may receive one or more ends (fourth end 156) of third leadframe 150. Thus, power module 2 of the present embodiment has sufficiently high reliability and can be miniaturized.

In power module 2 of the present embodiment, third leadframe 150 may further have third lateral surfaces 157 and 158. The second receiving portions (124, 127) may further face third lateral surfaces 157 and 158 of third leadframe 150. The second receiving portions (124, 127) can align third leadframe 150 in the second direction (y direction) that is the transverse direction of third leadframe 150. In power module 2 of the present embodiment, third leadframe 150 can be aligned with respect to resin frame 20e and second power semiconductor device 140 with higher accuracy.

A power module of a modification of the present embodiment will be described. The power module of the modification of the present embodiment may include no second receiving portion (124). The surface of resin frame 20e (second resin frame portion 20e2) may align third leadframe 150 in the third direction (z direction).

Embodiment 7

Figure 17:
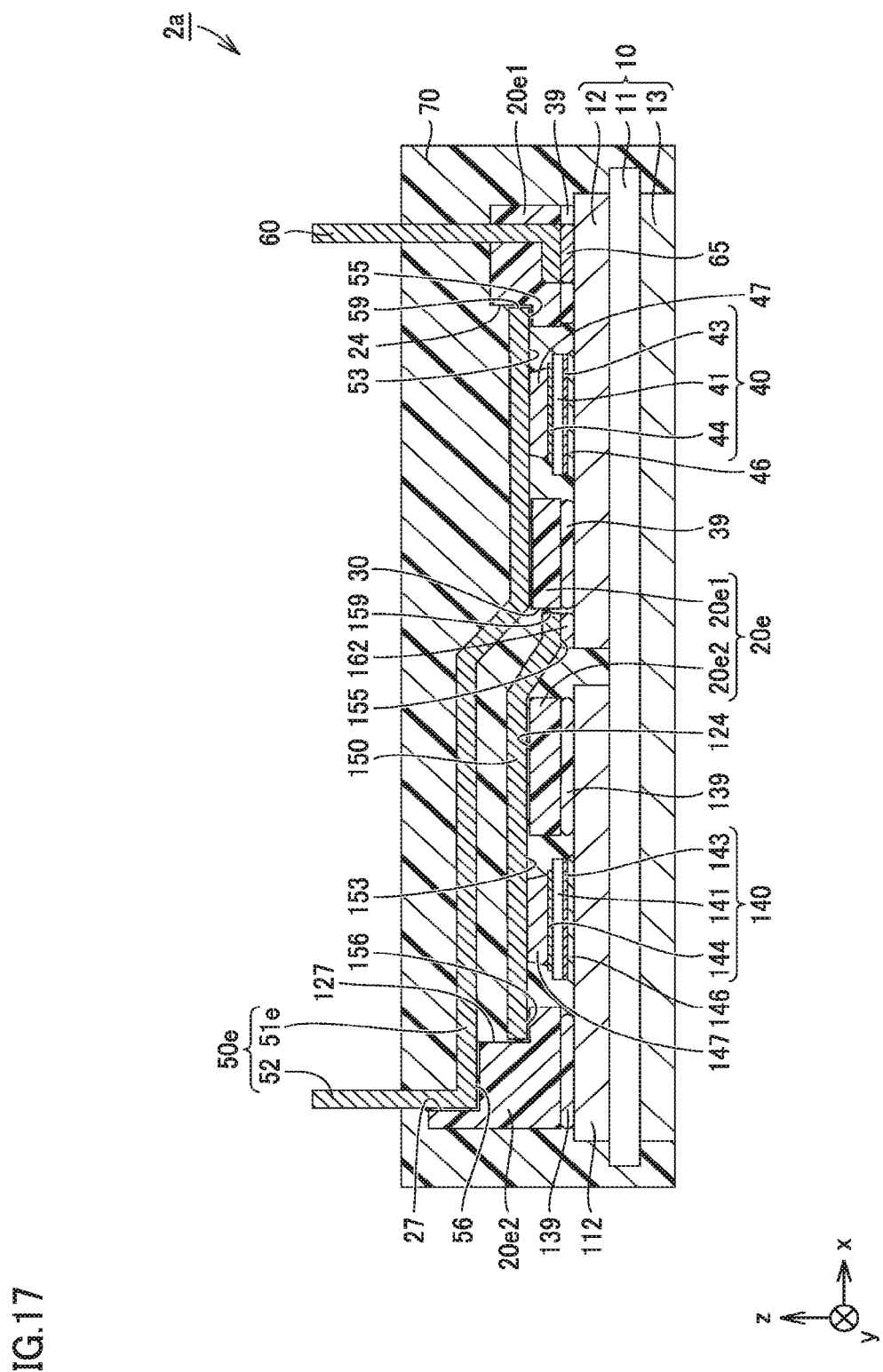
FIG. 17 is a schematic sectional view of a power module according to Embodiment 7 of the present invention.

A power module 2a according to Embodiment 7 will be described with reference to FIG. 17. Power module 2a of the present embodiment basically has a configuration similar to that of power module 2 of Embodiment 6 but differs from power module 2 mainly in the following respects.

Power module 2a of the present embodiment does not include second substrate 110 of power module 2 of Embodiment 6. In power module 2a of the present embodiment, first substrate 10 (first insulating plate 11) extends also below second power semiconductor device 140. First substrate 10 further includes a second conductive portion 112. Particularly, second conductive portion 112 is provided on the front surface of first insulating plate 11. Second conductive portion 112 is electrically isolated from first conductive portion 12. Conductive portion 13 is also provided on the rear surface of first insulating plate 11 below second power semiconductor device 140. Conductive portion 13 below first power semiconductor device 40 and conductive portion 13 below second power semiconductor device 140 may be integrated with each other. Conductive portion 13 below first power semiconductor device 40 and conductive portion 13 below second power semiconductor device 140 may be isolated from each other as in the case of first conductive portion 12 and second conductive portion 112, and conductive portion 13 may have a shape substantially symmetric to first conductive portion 12 and second conductive portion 112 about first insulating plate 11.

A method of manufacturing power module 2a of the present embodiment will be described. The method of manufacturing power module 2a of the present embodiment further includes the following steps in addition to those of the method of manufacturing power module 1 of Embodiment 1.

The method of manufacturing power module 2a of the present embodiment further includes arranging second power semiconductor device 140 including third electrode 144 and fourth electrode 143 on first substrate 10. First substrate 10 further includes second conductive portion 112 electrically isolated from first conductive portion 12. Resin frame 20e surrounds second power semiconductor device 140 and includes second depressions 124 and 127. Arranging of second power semiconductor device 140 on first substrate 10 includes electrically and mechanically connecting fourth electrode 143 of second power semiconductor device 140 to second conductive portion 112 of first substrate 10.

The method of manufacturing power module 2a of the present embodiment further includes positioning third leadframe 150 with respect to second depressions 124 and 127 such that second depressions 124 and 127 receive part of third leadframe 150, second depressions 124 and 127 face second main surface 153 of third leadframe 150, and second main surface 153 faces third electrode 144. The method of manufacturing power module 2a of the present embodiment further includes electrically and mechanically connecting third leadframe 150 to third electrode 144. The method further includes electrically and mechanically connecting fourth leadframe 160 to second conductive portion 112.

The effects of power module 2a of the present embodiment will be described. Power module 2a of the present embodiment achieves the following effects in addition to the effects of power module 2 of Embodiment 6.

Power module 2a of the present embodiment includes second power semiconductor device 140, third leadframe 150, and fourth leadframe 160. Second power semiconductor device 140 includes third electrode 144 and fourth electrode 143. Third leadframe 150 has second main surface 153 facing third electrode 144 and is electrically and mechanically connected to third electrode 144. First substrate 10 further includes second conductive portion 112. Fourth leadframe 160 is electrically and mechanically connected to second conductive portion 112. Fourth electrode 143 is electrically and mechanically connected to second conductive portion 112. Resin frame 20e is arranged on first substrate 10 so as to surround second power semiconductor device 140. Resin frame 20e further includes the second receiving portions (124, 127) facing second main surface 153 of third leadframe 150. The second receiving portions (124, 127) receive part of third leadframe 150.

In power module 2a of the present embodiment, not only first power semiconductor device 40 but also second power semiconductor device 140 is arranged on first substrate 10. Power module 2a of the present embodiment does not need to leave a space between first substrate 10 and second substrate 110 as in power module 2 of Embodiment 6. Power module 2a of the present embodiment can thus be miniaturized.

The effects of the method of manufacturing power module 2a of the present embodiment are similar to the effects of power module 2a of the present embodiment.

Embodiment 8

Figure 18:
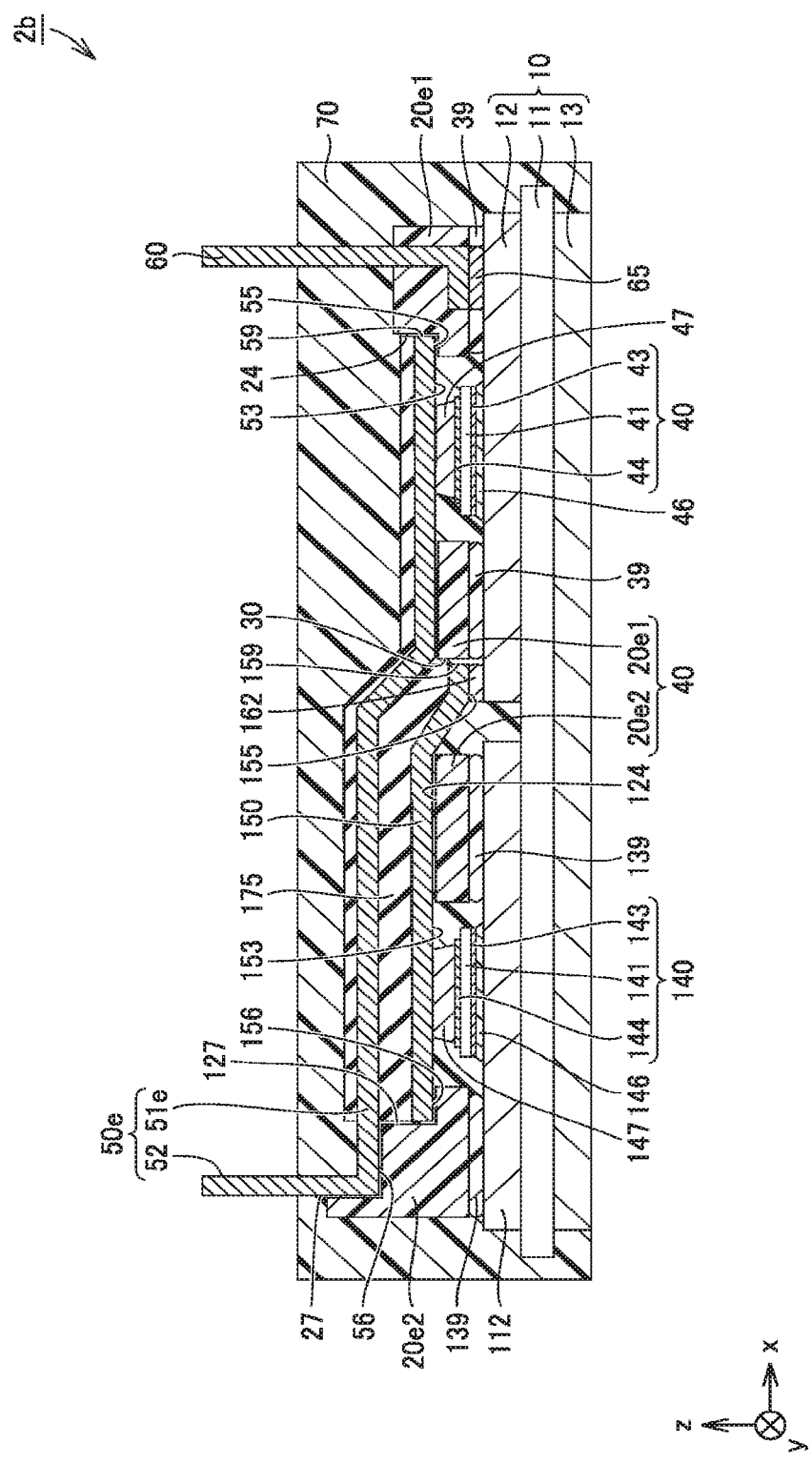
FIG. 18 is a schematic sectional view of a power module according to Embodiment 8 of the present invention.

A power module 2b according to Embodiment 8 will be described with reference to FIG. 18. Power module 2b of the present embodiment basically has a configuration similar to that of power module 2a of Embodiment 7 but differs from power module 2a mainly in the following respects.

Power module 2b of the present embodiment further includes an insulating film 175 between first leadframe 50e and third leadframe 150. Insulating film 175 may be made of, for example, polyimide, Nomex®, epoxy, polyphenylene sulfide (PPS), or liquid crystalline polymer (LCP). Part of first leadframe 50e may be exposed from insulating film 175. Particularly, at least one of first end 55 of first main surface 53 of first leadframe 50e and third end 155 of second main surface 153 of third leadframe 150 may be exposed from insulating film 175, and at least one of second end 56 of first main surface 53 of first leadframe 50e and fourth end 156 of second main surface 153 of third leadframe 150 may be exposed from insulating film 175.

Insulating film 175 between first leadframe 50e and third leadframe 150 may integrate first leadframe 50e and third leadframe 150 with each other. First leadframe 50e and third leadframe 150 may be laminated with insulating film 175 made of, for example, polyimide or Nomex® to integrate first leadframe 50e and third leadframe 150 with each other by insulating film 175. First leadframe 50e and third leadframe 150 may be molded with an insulating resin such as epoxy, polyphenylene sulfide (PPS), or liquid crystalline polymer (LCP) to integrate first leadframe 50e and third leadframe 150 with each other by insulating film 175.

A method of manufacturing power module 2b according to the present embodiment will be described. The method of manufacturing power module 2b of the present embodiment further includes the following steps in addition to those of the method of manufacturing power module 2a of Embodiment 7.

The method of manufacturing power module 2b according to the present embodiment includes integrating first leadframe 50e and third leadframe 150 with each other by insulating film 175 between first leadframe 50e and third leadframe 150. The method of manufacturing power module 2b according to the present embodiment includes positioning first leadframe 50e and third leadframe 150, which have been integrated with each other by insulating film 175, with respect to first depressions 24 and 27 and second depressions 124 and 127 such that first depressions 24 and 27 receive part of first leadframe 50e and that second depressions 124 and 127 receive part of third leadframe 150.

The effects of power module 2b of the present embodiment will be described. Power module 2b of the present embodiment achieves effects similar to those of power module 2a of Embodiment 7 but differs from power module 2a in the following respects.

Power module 2b of the present embodiment further includes insulating film 175 between first leadframe 50e and third leadframe 150. Insulating film 175 can reduce the interval between first leadframe 50e and third leadframe 150. Power module 2b of the present embodiment can be miniaturized and have low inductance.

In power module 2b of the present embodiment, first leadframe 50e and third leadframe 150 may be integrated with each other by insulating film 175. Since first leadframe 50e and third leadframe 150 are integrated with each other, first leadframe 50e and third leadframe 150 can be aligned together with respect to first power semiconductor device 40, second power semiconductor device 140, and resin frame 20e (first resin frame portion 20e1, second resin frame portion 20e2). Power module 2b of the present embodiment has such a structure as to reduce the cost and time for manufacturing power module 2b.

The effects of the method of manufacturing power module 2b of the present embodiment will be described. The method of manufacturing power module 2b according to the present embodiment includes positioning first leadframe 50e and third leadframe 150, which have been integrated with each other by insulating film 175 between first leadframe 50e and third leadframe 150, with respect to the first receiving portions (24, 27) and the second receiving portions (124, 127) such that the first receiving portions (24, 27) and the second receiving portions (124, 127) receive part of first leadframe 50e and that the second receiving portions (124, 127) receive part of third leadframe 150. First leadframe 50e and third leadframe 150 can be aligned together with respect to first power semiconductor device 40, second power semiconductor device 140, and resin frame 20e (first resin frame portion 20e1, second resin frame portion 20e2). The method of manufacturing power module 2b of the present embodiment can reduce the cost and time for manufacturing power module 2b.

A power module 2b of a modification of the present embodiment includes one of the first receiving portion (24) and the second receiving portion (124) and one of the first receiving portion (27) and the second receiving portions (124, 127). Since first leadframe 50e, third leadframe 150, and insulating film 175 are integrated with each other in power module 2b of the modification of the present embodiment, the other of the first receiving portion (24) and the second receiving portions (124, 127) and the other of the first receiving portion (27) and the second receiving portions (124, 127) can be omitted. Power module 2b of the modification of the present embodiment can thus be miniaturized further.

Embodiment 9

Figure 19:
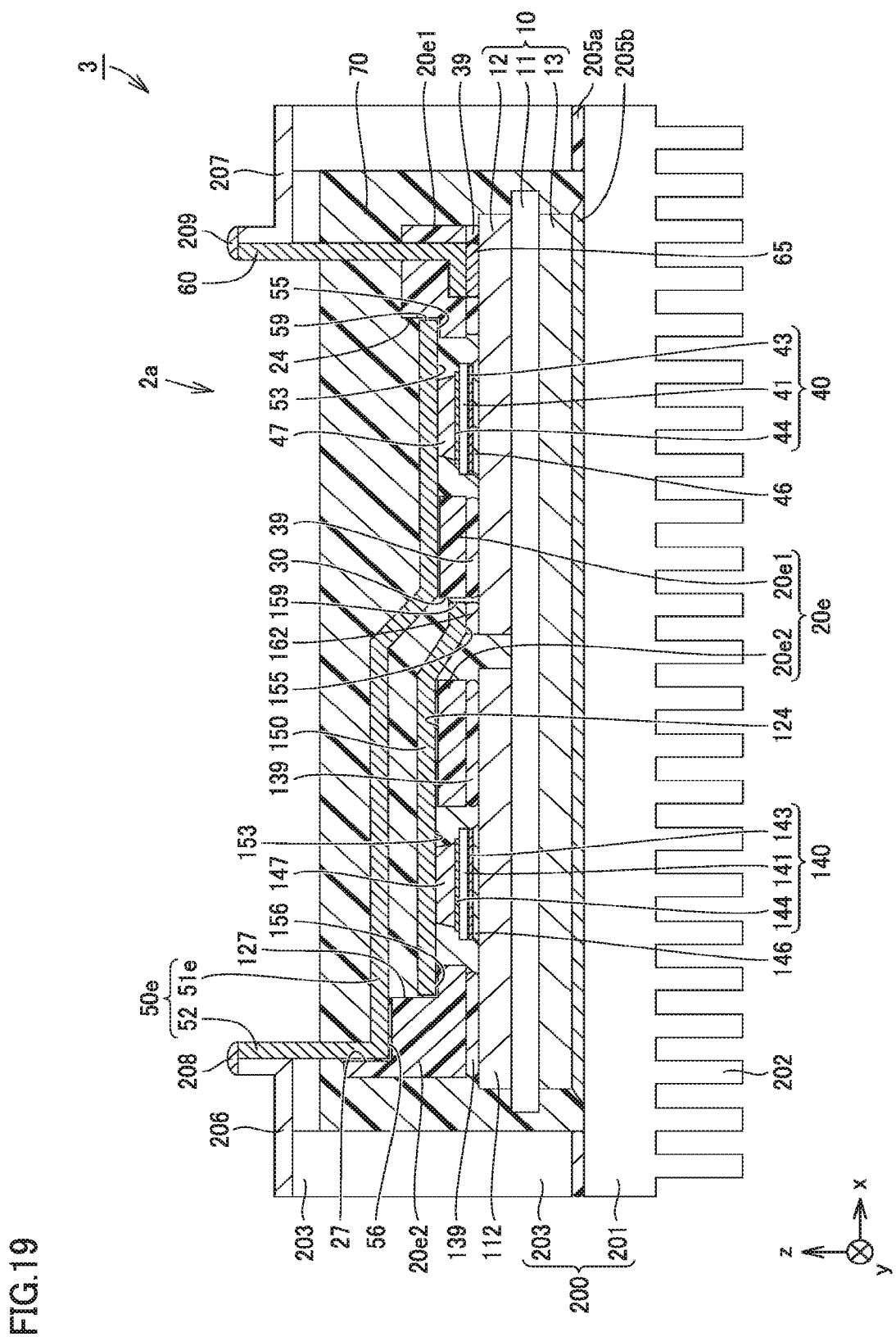
FIG. 19 is a schematic sectional view of a power electronic apparatus according to Embodiment 9 of the present invention.

A power electronic apparatus 3 according to Embodiment 9 will be described with reference to FIG. 19.

Power electronic apparatus 3 of the present embodiment includes power module 2a of Embodiment 7 and a case 200 accommodating power module 2a. In place of power module 2a of Embodiment 7, power modules 1, 1a, 1b, 1c, 1d, 2, and 2b of Embodiment 1 to Embodiment 6 and Embodiment 8 may be accommodated in case 200.

Case 200 includes a radiating member 201 and a tubular body 203. Radiating member 201 may be a plate made of a material having high thermal conductivity, such as a copper plate or an aluminum plate. Radiating member 201 dissipates the heat generated in power module 2a. Radiating member 201 may further include a radiating fin 202. Radiating member 201 including radiating fin 202 can dissipate the heat generated in power module 2a more efficiently. Tubular body 203 may be made of insulating resin. Tubular body 203 may be fixed on radiating member 201 with a bonding member 205a such as a silicon adhesive. Power module 2a is disposed on radiating member 201. Particularly, power module 2a is fixed on radiating member 201 with a bonding member 205b such as a solder or a thermal conductive grease.

Case 200 further includes a first bus bar 206 and a second bus bar 207. First bus bar 206 and second bus bar 207 may be integrally provided in case 200. Particularly, first bus bar 206 and second bus bar 207 may be integrally provided in tubular body 203. Case 200 may further include a third bus bar (not shown). The third bus bar may be integrally provided in case 200. Particularly, the third bus bar may be provided integrally in tubular body 203.

First bus bar 206 is electrically and mechanically connected to first leadframe 50e at a first connecting portion 208. Second bus bar 207 is electrically and mechanically connected to second leadframe 60 at a second connecting portion 209. The third bus bar is electrically and mechanically connected to fourth leadframe 160 (see FIG. 15) at a third connecting portion (not shown). First bus bar 206, second bus bar 207, and the third bus bar may be electrically and mechanically connected to first leadframe 50e, second leadframe 60, and fourth leadframe 160, respectively, by welding such as TIG welding or laser welding. First bus bar 206, second bus bar 207, and the third bus bar may be screwed to first leadframe 50e, second leadframe 60, and fourth leadframe 160, respectively.

Sealing resin body 70 seals the interior of case 200. Sealing resin body 70 may be made of, for example, an insulating resin material such as an epoxy resin or gel.

The effects of power electronic apparatus 3 of the present embodiment will be described.

Power electronic apparatus 3 of the present embodiment includes power module 2a of Embodiment 7. Power electronic apparatus 3 of the present embodiment accordingly achieves effects similar to those of power module 2a of Embodiment 7. For example, power electronic apparatus 3 of the present embodiment has sufficiently high reliability and can be miniaturized.

Power electronic apparatus 3 of the present embodiment includes power module 2a and case 200 accommodating power module 2a. Case 200 includes first bus bar 206 and second bus bar 207. First bus bar 206 and second bus bar 207 are electrically and mechanically connected to first leadframe 50e and second leadframe 60, respectively. First connecting portion 208 for first leadframe 50e and first bus bar 206 and second connecting portion 209 for second leadframe 60 and second bus bar 207 are accordingly located above (in the +z direction) power module 2a. Power electronic apparatus 3 of the present embodiment can be miniaturized in the directions in which the main surface of first substrate 10 extends, that is, in the first direction (x direction) and the second direction (y direction). Further, power electronic apparatus 3 of the present embodiment has low inductance because the length of wiring from power module 2a to first bus bar 206 and second bus bar 207 can be reduced.

In power electronic apparatus 3 of the present embodiment, case 200 accommodates power module 2a. Power electronic apparatus 3 of the present embodiment can protect power module 2a from mechanical impact.

In power electronic apparatus 3 of the present embodiment, case 200 includes radiating member 201. Power module 2a is disposed on radiating member 201. Power electronic apparatus 3 of the present embodiment can efficiently dissipate the heat generated in power module 2a by radiating member 201.

Embodiment 10

Figure 20:
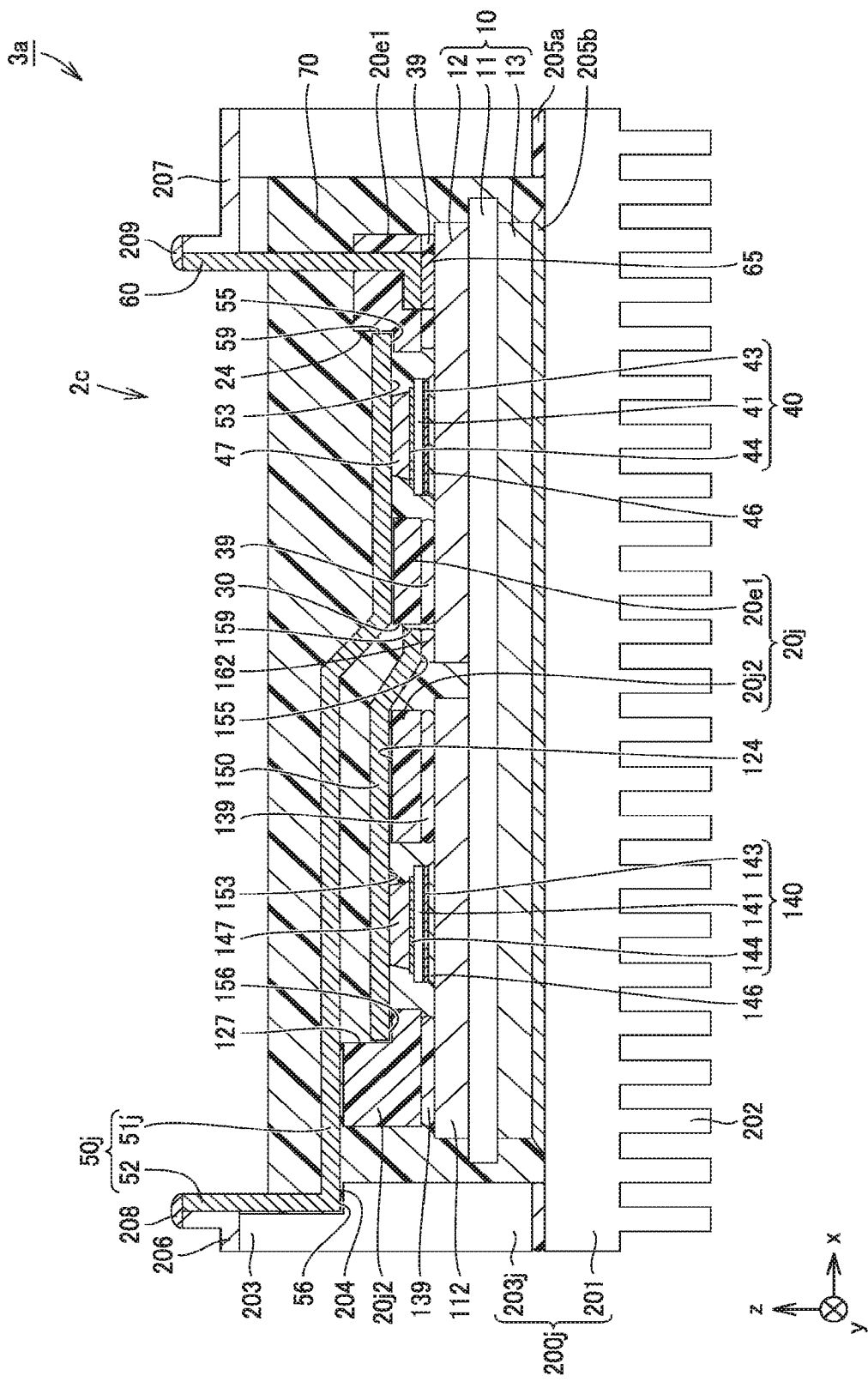
FIG. 20 is a schematic sectional view of a power electronic apparatus according to Embodiment 10 of the present invention.

A power electronic apparatus 3a according to Embodiment 10 will be described with reference to FIG. 20. Power electronic apparatus 3a of the present embodiment basically has a configuration similar to that of power electronic apparatus 3 of Embodiment 9 but differs from power electronic apparatus 3 mainly in the following respects.

Power electronic apparatus 3a of the present embodiment includes a power module 2c and a case 200j accommodating power module 2c. Power module 2c of the present embodiment has a configuration similar to that of power module 2a of Embodiment 9 but differs from power module 2a in the following respects. First, in power module 2c of the present embodiment, a first leadframe portion 51j of a first leadframe 50j extends to a third receiving portion (204) included in case 200j. Second, in power module 2c of the present embodiment, a resin frame 20j includes no first depression 27 (see FIG. 19). Particularly, second resin frame portion 20j2 of the present embodiment includes no first depression 27 (see FIG. 19).

Case 200j includes the third receiving portion (204) facing first main surface 53 of first leadframe 50j. The third receiving portion (204) may be a third depression 204. Particularly, a tubular body 203j includes third depression 204 facing first main surface 53 of first leadframe 50j. Third depression 204 receives part of first leadframe 50j. Particularly, third depression 204 receives second end 56 of first leadframe 50j. First leadframe 50j is not present inside tubular body 203j per se. Tubular body 203j per se includes no first leadframe 50j. First leadframe 50j is not fixed directly to case 200j (tubular body 203j).

A method of manufacturing power electronic apparatus 3a of the present embodiment will be described with reference to FIGS. 20 to 24. The method of manufacturing power electronic apparatus 3a of the present embodiment includes the following steps.

Figure 21:
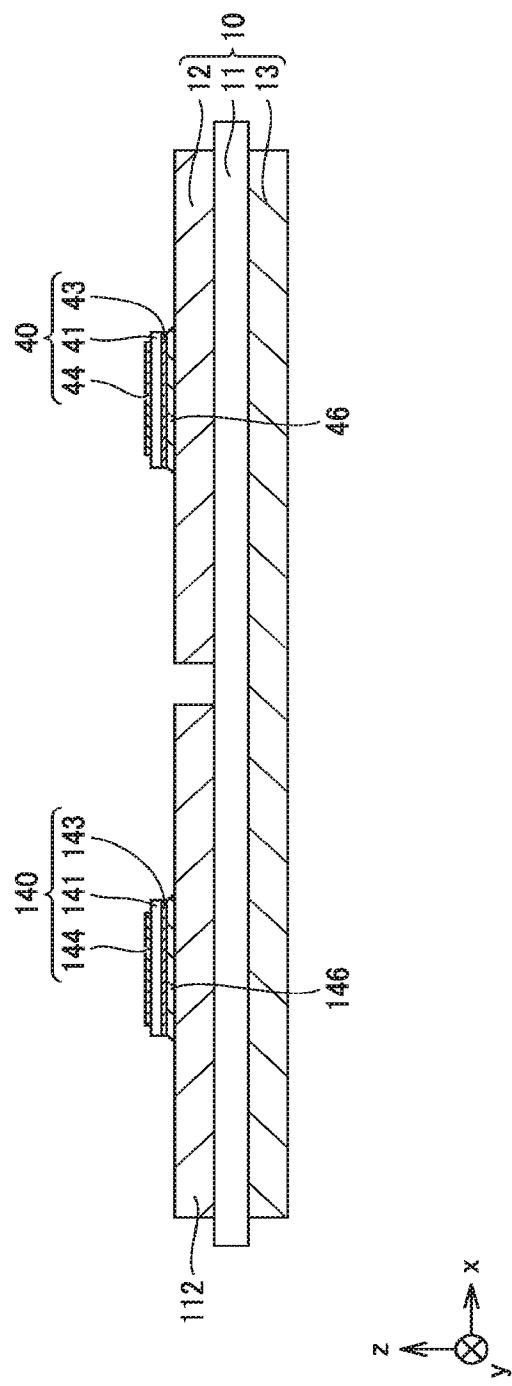
FIG. 21 is a schematic sectional view showing one step of a method of manufacturing the power electronic apparatus according to Embodiment 10 of the present invention.
Figure 22:
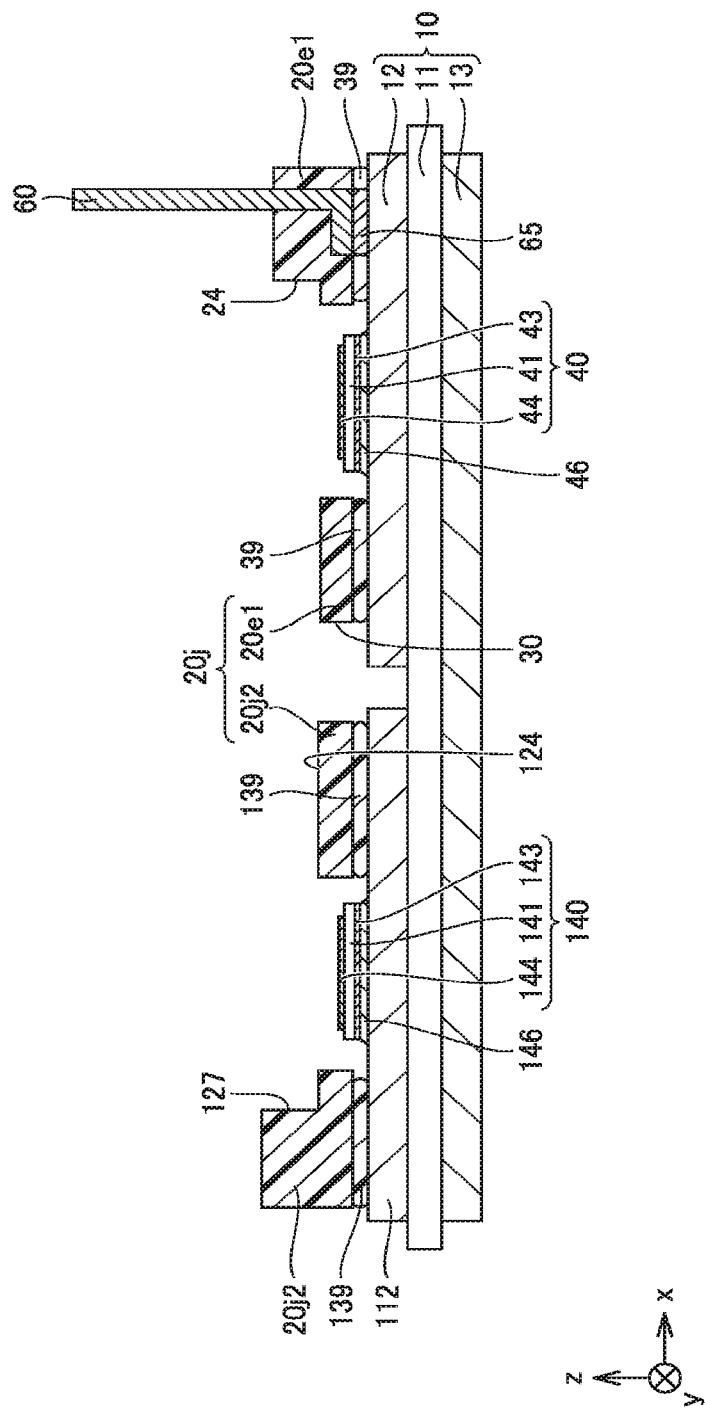
FIG. 22 is a schematic sectional view showing a step following the step shown in FIG. 21 in the method of manufacturing the power electronic apparatus according to Embodiment 10 of the present invention.

With reference to FIGS. 21 and 22, the method of manufacturing power electronic apparatus 3a of the present embodiment includes arranging first power semiconductor device 40 and resin frame 20j on first substrate 10 including first conductive portion 12. First power semiconductor device 40 includes first electrode 44 and second electrode 43. Resin frame 20j surrounds first power semiconductor device 40 and includes first depression 24. Arranging of first power semiconductor device 40 on first substrate 10 includes electrically and mechanically connecting second electrode 43 of first power semiconductor device 40 to first conductive portion 12.

Particularly, as shown in FIG. 21, first power semiconductor device 40 including first electrode 44 and second electrode 43 and second power semiconductor device 140 including third electrode 144 and fourth electrode 143 are arranged on first substrate 10. Second electrode 43 of first power semiconductor device 40 may be electrically and mechanically connected to first conductive portion 12 of first substrate 10 with solder 46. Fourth electrode 143 of second power semiconductor device 140 may be electrically and mechanically connected to second conductive portion 112 of first substrate 10 with solder 146.

As shown in FIG. 22, first resin frame portion 20e1 of resin frame 20j may be fixedly bonded on first substrate 10 with adhesive 39. First resin frame portion 20e1 may be arranged on first substrate 10 so as to surround first power semiconductor device 40. First resin frame portion 20e1 may include first depression 24 and third recess 30. Second resin frame portion 20j2 of resin frame 20j may be fixedly bonded on first substrate 10 with adhesive 139. Second resin frame portion 20j2 may be arranged on first substrate 10 so as to surround second power semiconductor device 140. Second resin frame portion 20j2 may include second depressions 124 and 127.

As shown in FIG. 22, the method of manufacturing power electronic apparatus 3a of the present embodiment includes electrically and mechanically connecting second leadframe 60 to first conductive portion 12. Second leadframe 60 may be electrically and mechanically connected to first conductive portion 12 with conductive bonding member 65 such as solder. Part of second leadframe 60 may be integrated with first resin frame portion 20e1. The method of manufacturing power electronic apparatus 3a of the present embodiment includes electrically and mechanically connecting fourth leadframe 160 (see FIG. 15) to second conductive portion 112. Fourth leadframe 160 may be electrically and mechanically connected to second conductive portion 112 with conductive bonding member 165 (not shown) such as solder. Part of fourth leadframe 160 may be integrated with second resin frame portion 20j2.

Figure 23:
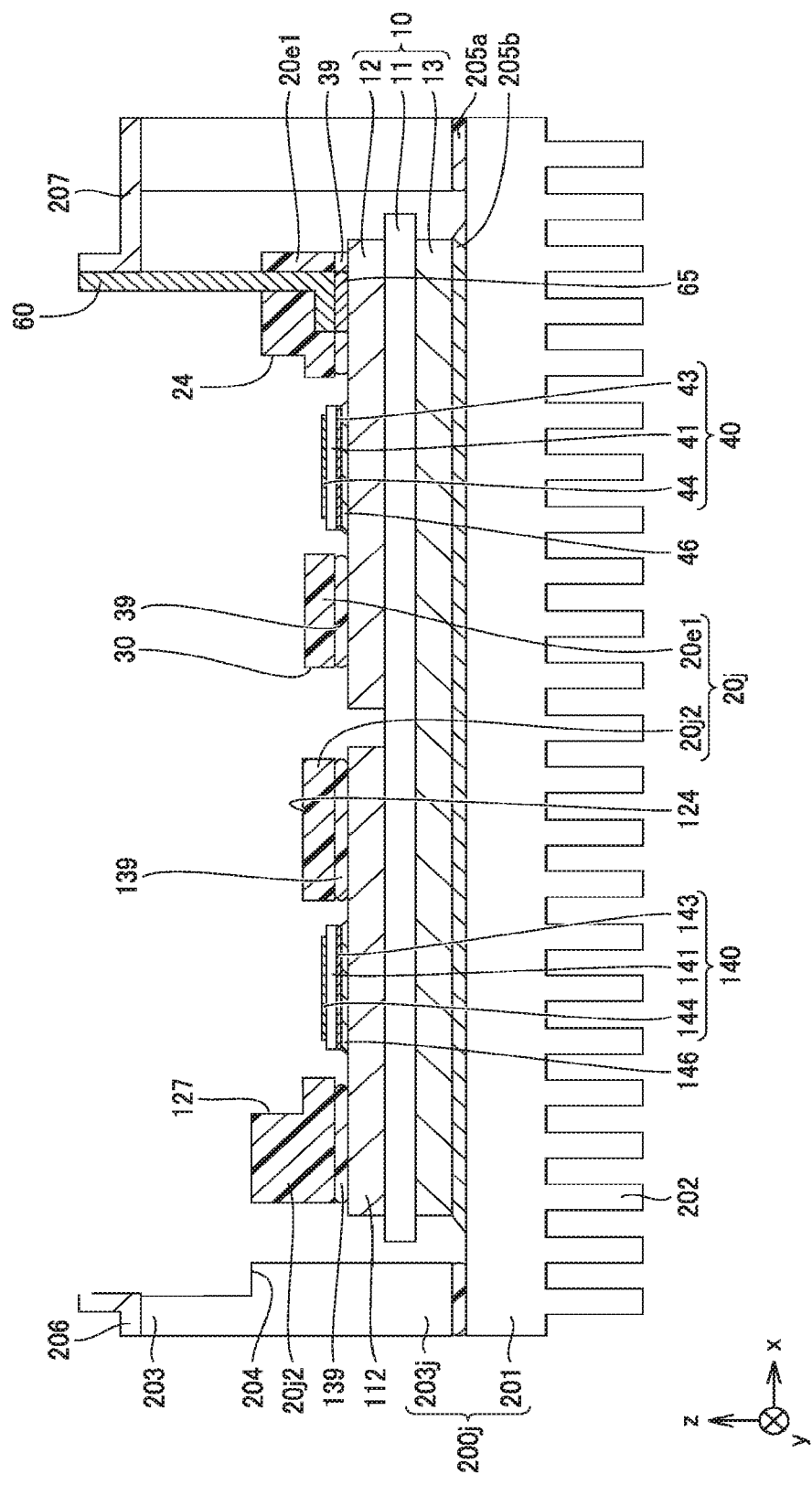
FIG. 23 is a schematic sectional view showing a step following the step shown in FIG. 22 in the method of manufacturing the power electronic apparatus according to Embodiment 10 of the present invention.

With reference to FIG. 23, the method of manufacturing power electronic apparatus 3a of the present embodiment includes accommodating first substrate 10 in case 200j including first bus bar 206, second bus bar 207, and third depression 204. Particularly, first substrate 10, first power semiconductor device 40, second power semiconductor device 140, resin frame 20j, and second leadframe 60 shown in FIG. 22, and fourth leadframe 160 (see FIG. 15) may be accommodated in case 200j including first bus bar 206, second bus bar 207, the third bus bar (not shown), and third depression 204. First bus bar 206, second bus bar 207, and third bus bar may be provided in case 200j. Particularly, first bus bar 206, second bus bar 207, and the third bus bar may be provided in tubular body 203j.

Figure 24:
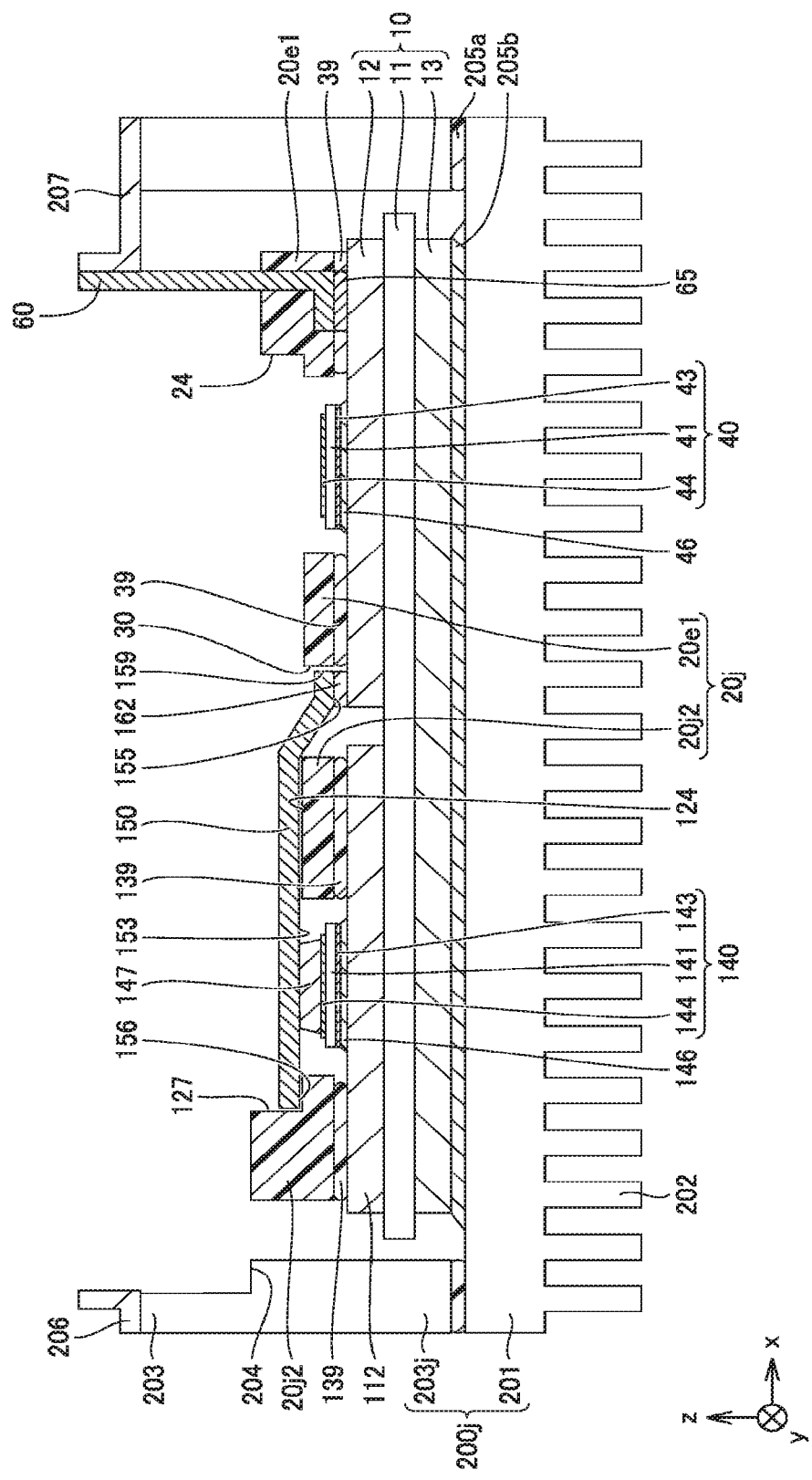
FIG. 24 is a schematic sectional view showing a step following the step shown in FIG. 23 in the method of manufacturing the power electronic apparatus according to Embodiment 10 of the present invention.

With reference to FIG. 24, the method of manufacturing power electronic apparatus 3a of the present embodiment may include positioning third leadframe 150 with respect to second depressions 124 and 127 and third recess 30 such that second depressions 124 and 127 and third recess 30 receive part of third leadframe 150, second depressions 124 and 127 face second main surface 153 of third leadframe 150, and second main surface 153 faces third electrode 144. Particularly, second depression 127 and third recess 30 may receive one or more ends (third end 155, fourth end 156) of third leadframe 150. Second depressions 124 and 127 can align third leadframe 150 in the third direction (z direction) orthogonal to second main surface 153.

More particularly, second depressions 124 and 127 and third recess 30 may face third lateral surfaces 157 and 158 of third leadframe 150. Herein, second depressions 124 and 127 and third recess 30 facing third lateral surfaces 157 and 158 of third leadframe 150 means that second depressions 124 and 127 and third recess 30 face at least one of a pair of third lateral surfaces 157 and 158. Second depressions 124 and 127 and third recess 30 can align third leadframe 150 in the second direction (y direction) that is the transverse direction of third leadframe 150. Second depression 127 and third recess 30 may further face the surface (e.g., fourth lateral surface 159) of third leadframe 150 which intersects second main surface 153 and third lateral surfaces 157 and 158. Second depression 127 and third recess 30 can align third leadframe 150 in the first direction (x direction) that is the longitudinal direction of third leadframe 150. Second depression 127 and third recess 30 may face at least one of third lateral surfaces 157 and 158 and the surface (e.g., fourth lateral surface 159) of third leadframe 150 which intersects second main surface 153 and third lateral surfaces 157 and 158.

The method of manufacturing power electronic apparatus 3a of the present embodiment may include electrically and mechanically connecting third leadframe 150 to third electrode 144 of second power semiconductor device 140. Specifically, third leadframe 150 is electrically and mechanically connected to third electrode 144 of second power semiconductor device 140 with conductive bonding member 147 such as solder. The method of manufacturing power electronic apparatus 3a of the present embodiment may include electrically and mechanically connecting third end 155 of third leadframe 150 to first conductive portion 12 with conductive bonding member 162 such as solder.

Figure 25:
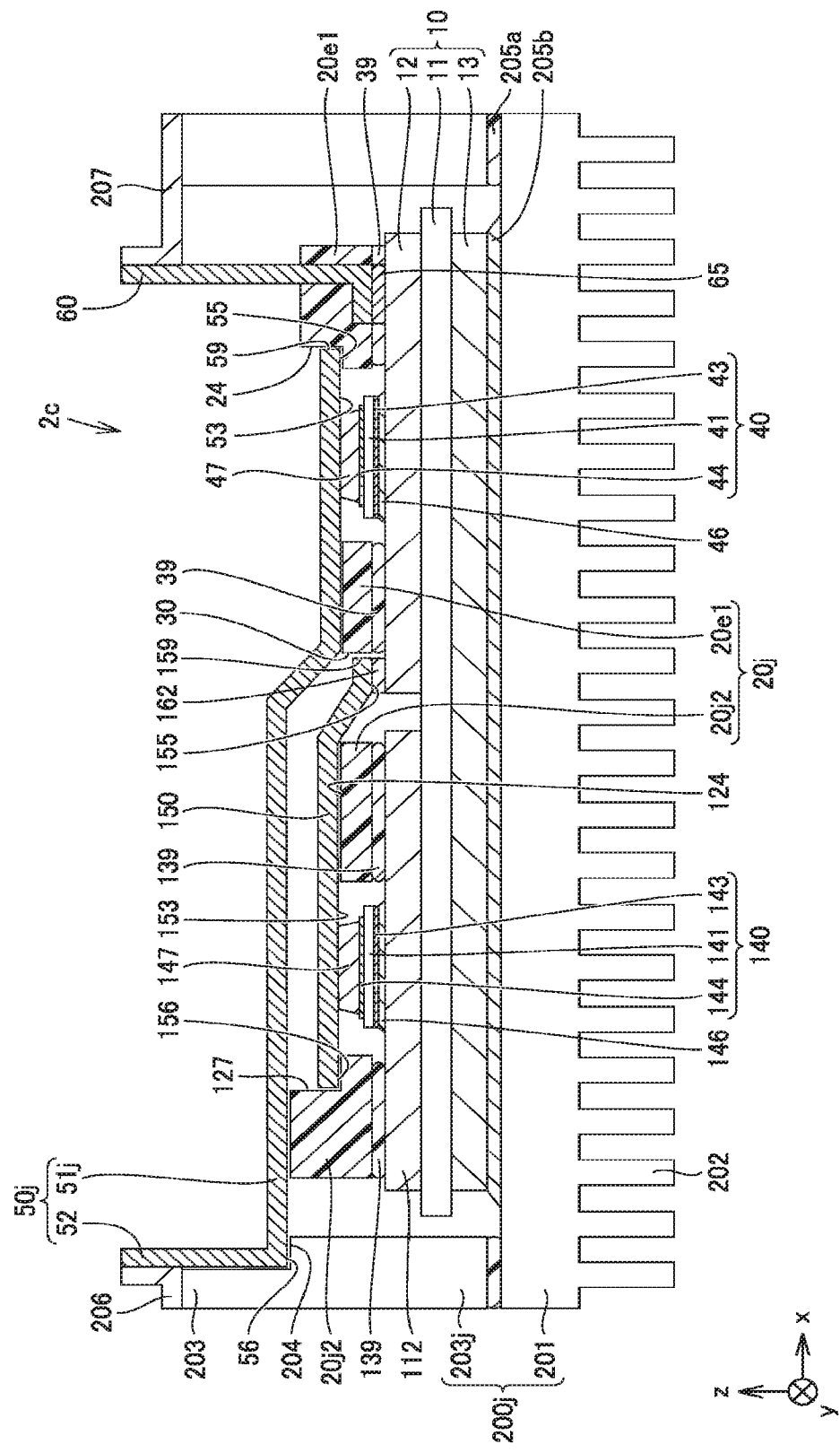
FIG. 25 is a schematic sectional view showing a step following the step shown in FIG. 24 in the method of manufacturing the power electronic apparatus according to Embodiment 10 of the present invention.

With reference to FIG. 25, the method of manufacturing power electronic apparatus 3a of the present embodiment includes positioning first leadframe 50j with respect to third depression 24 and third depression 204 such that first depression 24 and third depression 204 receive part of first leadframe 50j, first depression 24 and third depression 204 face first main surface 53 of first leadframe 50j, and first main surface 53 faces first electrode 44. Particularly, first depression 24 and third depression 204 may receive one or more ends (first end 55, second end 56) of first leadframe 50j. First depression 24 and third depression 204 can align first leadframe 50j in the third direction (z direction) orthogonal to first main surface 53.

More particularly, first depression 24 and third depression 204 may face first lateral surfaces 57 and 58 of first leadframe 50j. First depression 24 and third depression 204 can align first leadframe 50j in the second direction (y direction) that is the transverse direction of first leadframe 50j. First depression 24 and third depression 204 may further face the surface (e.g., second lateral surface 59) of first leadframe 50j which intersects first main surface 53 and first lateral surfaces 57 and 58. First depression 24 and third depression 204 can align first leadframe 50j in the first direction (x direction) that is the longitudinal direction of first leadframe 50j.

The method of manufacturing power electronic apparatus 3a of the present embodiment includes electrically and mechanically connecting first leadframe 50j to first electrode 44. Specifically, first leadframe 50j is electrically and mechanically connected to first electrode 44 of first power semiconductor device 40 with conductive bonding member 47 such as solder. Consequently, power module 2c is accommodated in case 200j.

Figure 26:
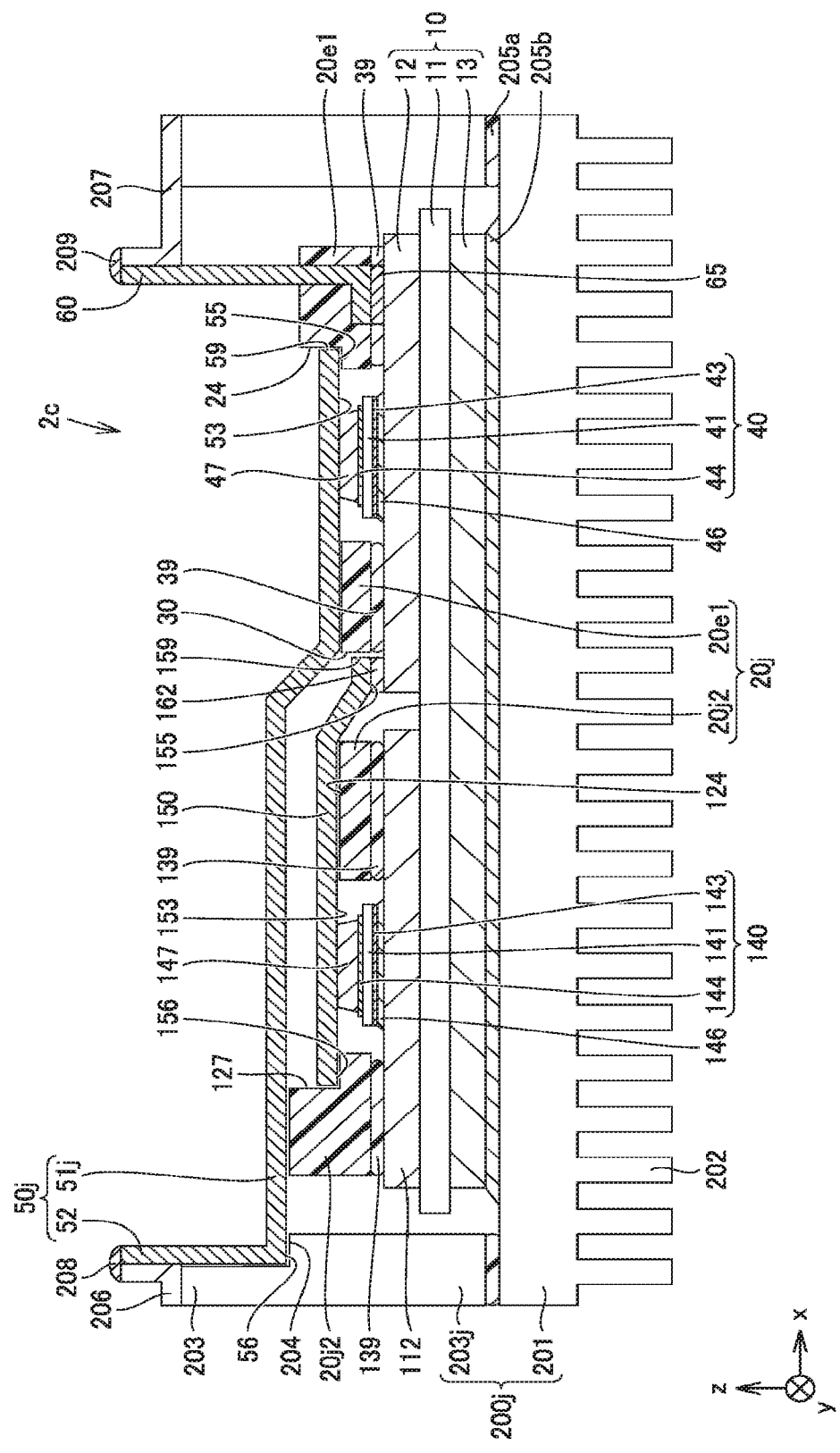
FIG. 26 is a schematic sectional view showing a step following the step shown in FIG. 25 in the method of manufacturing the power electronic apparatus according to Embodiment 10 of the present invention.

With reference to FIG. 26, the method of manufacturing power electronic apparatus 3a of the present embodiment includes electrically and mechanically connecting first leadframe 50j to first bus bar 206. The method of manufacturing power electronic apparatus 3a of the present embodiment includes electrically and mechanically connecting second leadframe 60 to second bus bar 207. The method of manufacturing power electronic apparatus 3a of the present embodiment may include electrically and mechanically connecting fourth leadframe 160 (see FIG. 15) to the third bus bar (not shown).

Particularly, first bus bar 206 is electrically and mechanically connected to first leadframe 50j at first connecting portion 208. Second bus bar 207 is electrically and mechanically connected to second leadframe 60 at second connecting portion 209. The third bus bar (not shown) is electrically and mechanically connected to fourth leadframe 160 (see FIG. 15) at the third connecting portion (not shown). First bus bar 206, second bus bar 207, and the third bus bar may be electrically and mechanically connected to first leadframe 50j, second leadframe 60, and fourth leadframe 160, respectively, by welding such as TIG welding or laser welding. First bus bar 206, second bus bar 207, and the third bus bar may be screwed to first leadframe 50j, second leadframe 60, and fourth leadframe 160, respectively.

The method of manufacturing power electronic apparatus 3a of the present embodiment may include sealing power module 2c with sealing resin body 70. Particularly, power module 2c in case 200j may be sealed with sealing resin body 70 provided in case 200j.

The effects of power electronic apparatus 3a of the present embodiment will be described. Power electronic apparatus 3a of the present embodiment achieves effects similar to those of power electronic apparatus 3 of Embodiment 9 but differs from power electronic apparatus 3 in the following respects.

In power electronic apparatus 3a of the present embodiment, the first receiving portion (24) and the third receiving portion (204) receive part of first leadframe 50j, so that first leadframe 50j can be aligned not only with respect to resin frame 20j, first power semiconductor device 40, and second power semiconductor device 140 but also with respect to case 200j (tubular body 203j). Power electronic apparatus 3a of the present embodiment does not need to leave a space for receiving a jig for alignment of first leadframe 50j. Power electronic apparatus 3a of the present embodiment can thus be miniaturized.

In power electronic apparatus 3a of the present embodiment, the first receiving portion (24) and the third receiving portion (204) receive part of first leadframe 50j. First leadframe 50j is not fixed directly to resin frame 20j and case 200j. Power electronic apparatus 3a of the present embodiment can thus have an improved degree of flexibility in design of first leadframe 50j.

In power electronic apparatus 3a of the present embodiment, case 200j includes the third receiving portion (204) facing first main surface 53 of first leadframe 50j. The third receiving portion (204) receives part of first leadframe 50j. Since case 200j includes the third receiving portion (204) that receives part of first leadframe 50j, part (first receiving portion (27)) of one or more first receiving portions (24, 27) of Embodiment 9 (see FIG. 19) can be omitted. Power electronic apparatus 3a of the present embodiment can thus be miniaturized further.

The effects of the method of manufacturing power electronic apparatus 3a of the present embodiment will be described.

The method of manufacturing power electronic apparatus 3a of the present embodiment includes arranging first power semiconductor device 40 including first electrode 44 and second electrode 43 and resin frame 20j including the first receiving portion (24) on first substrate 10 including first conductive portion 12. Arranging of first power semiconductor device 40 on first substrate 10 includes electrically and mechanically connecting second electrode 43 of first power semiconductor device 40 to first conductive portion 12. The method of manufacturing power electronic apparatus 3a of the present embodiment includes electrically and mechanically connecting second leadframe 60 to first conductive portion 12. The method of manufacturing power electronic apparatus 3a of the present embodiment includes accommodating first substrate 10 in case 200j including first bus bar 206, second bus bar 207, and the third receiving portion (204). The method of manufacturing power electronic apparatus 3a of the present embodiment includes positioning first leadframe 50j with respect to the first receiving portion (24) and the third receiving portion (204) such that the first receiving portion (24) and the third receiving portion (204) receive part of first leadframe 50j, the first receiving portion (24) and the third receiving portion (204) face first main surface 53 of first leadframe 50j, and first main surface 53 faces first electrode 44. The method of manufacturing power electronic apparatus 3a of the present embodiment includes electrically and mechanically connecting first leadframe 50j to first electrode 44. The method of manufacturing power electronic apparatus 3a of the present embodiment includes electrically and mechanically connecting first leadframe 50j to first bus bar 206. The method of manufacturing power electronic apparatus 3a of the present embodiment includes electrically and mechanically connecting second leadframe 60 to second bus bar 207.

The method of manufacturing power electronic apparatus 3a of the present embodiment includes electrically and mechanically connecting first leadframe 50j to first bus bar 206, and electrically and mechanically connecting second leadframe 60 to second bus bar 207. The method of manufacturing power electronic apparatus 3a of the present embodiment can manufacture power electronic apparatus 3a having, for example, sufficiently high reliability in a heat cycle test. The method of manufacturing power electronic apparatus 3a of the present embodiment further includes positioning first leadframe 50j with respect to the first receiving portion (24) and the third receiving portion (204) such that the first receiving portion (24) and the third receiving portion (204) receive part of first leadframe 50j, the first receiving portion (24) and the third receiving portion (204) face first main surface 53 of first leadframe 50j, and first main surface 53 faces first electrode 44. The method of manufacturing power electronic apparatus 3a of the present embodiment does not need to leave a space for receiving a jig for alignment of first leadframe 50j. The method of manufacturing power electronic apparatus 3a of the present embodiment can manufacture power electronic apparatus 3a that can be miniaturized.

The method of manufacturing power electronic apparatus 3a of the present embodiment can bond first leadframe 50j to first electrode 44 of first power semiconductor device 40 easily and reliably by the first receiving portion (24) and the third receiving portion (204). The method of manufacturing power electronic apparatus 3a of the present embodiment provides improved productivity.

The method of manufacturing power electronic apparatus 3a of the present embodiment includes positioning first leadframe 50j with respect to the first receiving portion (24) and the third receiving portion (204) such that the first receiving portion (24) and the third receiving portion (204) receive part of first leadframe 50j. First leadframe 50j is not fixed directly to resin frame 20j. The method of manufacturing power electronic apparatus 3a of the present embodiment can accordingly provide an improved flexibility in design of first leadframe 50j.

The method of manufacturing power electronic apparatus 3a of the present embodiment includes positioning first leadframe 50j with respect to the first receiving portion (24) and the third receiving portion (204) such that the first receiving portion (24) and the third receiving portion (204) receive part of first leadframe 50j. Part (first receiving portion (27)) of one or more first receiving portions (24, 27) of Embodiment 9 (see FIG. 19) can be omitted because case 200j includes the third receiving portion (204) that receives part of first leadframe 50j. The method of manufacturing power electronic apparatus 3a of the present embodiment can further miniaturize power electronic apparatus 3a.

The method of manufacturing power electronic apparatus 3a of the present embodiment includes accommodating first substrate 10 in case 200j including first bus bar 206, second bus bar 207, and the third receiving portion (204), electrically and mechanically connecting first leadframe 50j to first bus bar 206, and electrically and mechanically connecting second leadframe 60 to second bus bar 207. First connecting portion 208 for first leadframe 50j and first bus bar 206 and second connecting portion 209 for second leadframe 60 and second bus bar 207 are accordingly located above (in the +z direction) power module 2c. The method of manufacturing power electronic apparatus 3a of the present embodiment can thus miniaturize power electronic apparatus 3a in the directions in which the main surface of first substrate 10 extends, that is, in the first direction (x direction) and the second direction (y direction). The method of manufacturing power electronic apparatus 3a of the present embodiment can reduce the length of wiring from power module 2c to first bus bar 206 and second bus bar 207. The method of manufacturing power electronic apparatus 3a of the present embodiment can manufacture power electronic apparatus 3a having low inductance. The method of manufacturing power electronic apparatus 3a of the present embodiment includes accommodating first substrate 10 in case 200j including first bus bar 206, second bus bar 207, and the third receiving portion (204). The method of manufacturing power electronic apparatus 3a of the present embodiment can protect power module 2c from mechanical impact.

Embodiment 11

Figure 27:
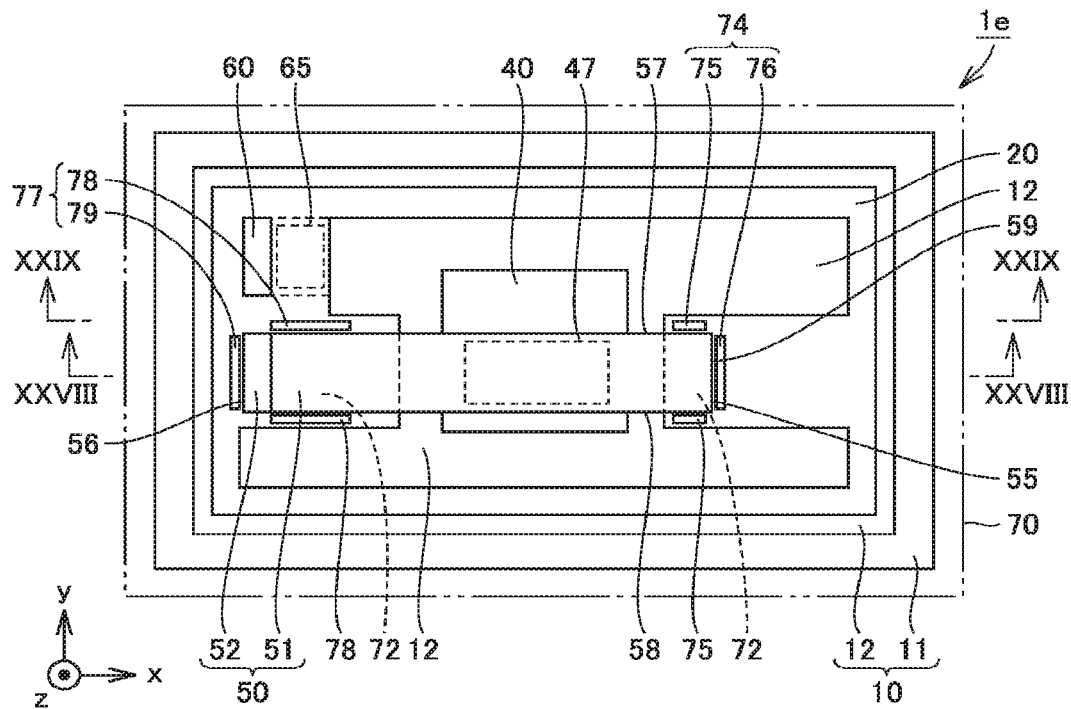
FIG. 27 is a schematic plan view of a power module according to Embodiment 11 of the present invention.
Figure 28:
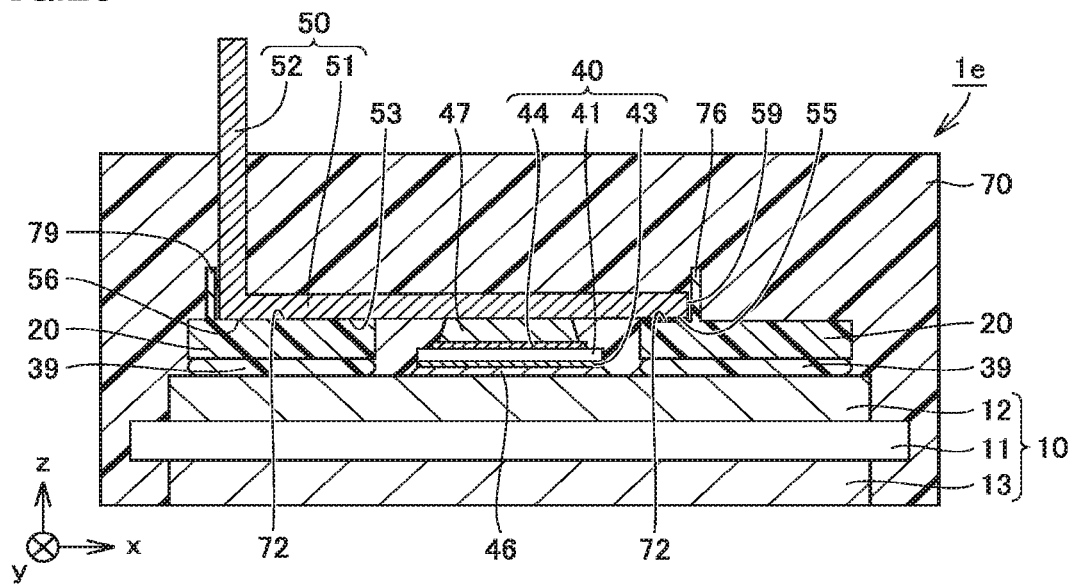
FIG. 28 is a schematic sectional view of the power module according to Embodiment 11 of the present invention, which is taken along the section line XXVIII-XXVIII shown in FIG. 27.
Figure 29:
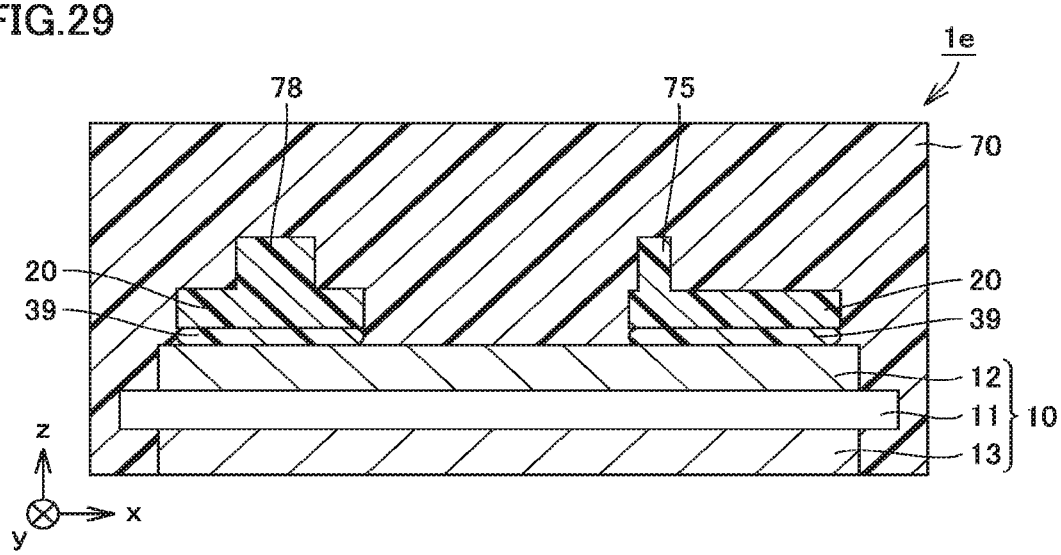
FIG. 29 is a schematic sectional view of the power module according to Embodiment 11 of the present invention, which is taken along the section line XXIX-XXIX shown in FIG. 27.

A power module 1e according to Embodiment 11 will be described with reference to FIGS. 27 to 29. Power module 1e of the present embodiment has a configuration similar to that of power module 1 of Embodiment 1 but differs from power module 1 mainly in the following respects.

In power module 1e of the present embodiment, resin frame 20 includes one or more first receiving portions (72, 74, 77) facing first main surface 53 of first leadframe 50. Specifically, resin frame 20 includes the first receiving portions (72, 74) and the first receiving portions (72, 77). One or more first receiving portions (72, 74, 77) include third main surface 72 of resin frame 20 which faces first main surface 53 and protrusions 74 and 77 projecting from third main surface 72. Protrusions 74 and 77 face at least one of first lateral surfaces 57 and 58 of first leadframe 50 and the surface (e.g., second lateral surface 59) of first leadframe 50 which intersects first main surface 53 and first lateral surfaces 57 and 58. Resin frame 20 has third main surface 72 and includes protrusions 74 and 77 projecting from third main surface 72. Protrusion 74 may face first end 55 of first leadframe 50. Protrusion 77 may face second end 56 of first leadframe 50.

One or more first receiving portions (72, 74, 77) receive part of first leadframe 50. First leadframe 50 is not present inside resin frame 20 per se. Resin frame 20 per se includes no first leadframe 50. First leadframe 50 is not fixed directly to resin frame 20. First leadframe 50 may be in contact with one or more first receiving portions (72, 74, 77). Particularly, first leadframe 50 may be in contact with the bottom surfaces of one or more first receiving portions (72, 74, 77), that is, third main surface 72. First leadframe 50 may be located above the bottom surfaces of one or more first receiving portions (72, 74, 77), that is, third main surface 72. One or more first receiving portions (72, 74, 77) can align first leadframe 50 in the third direction (z direction) orthogonal to first main surface 53.

Particularly, one or more first receiving portions (72, 74, 77) may receive one or more ends (first end 55, second end 56) of first leadframe 50. The first receiving portions (72, 74) may receive first end 55 of first leadframe 50. The first receiving portions (72, 77) may receive second end 56 of first leadframe 50. To electrically and mechanically connect first leadframe 50 to first power semiconductor device 40, one or more first receiving portions (72, 74, 77) may be configured such that first leadframe 50 does not collide with first power semiconductor device 40 when first leadframe 50 is moved from above (in the +z direction) first power semiconductor device 40 toward first power semiconductor device 40. For example, the distance between the bottom surfaces (third main surface 72) of one or more first receiving portions (72, 74, 77) and the front surface of first substrate 10 (the front surface of first conductive portion 12) may be greater than the distance between the front surface of second electrode 43 of first power semiconductor device 40 and the front surface of first substrate 10 (the front surface of first conductive portion 12).

One or more first receiving portions (72, 74, 77) may further face first lateral surfaces 57 and 58 of first leadframe 50. One or more first receiving portions (72, 74, 77) can align first leadframe 50 in the second direction (y direction) that is the transverse direction of first leadframe 50. One or more first receiving portions (72, 74, 77) may further face the surface (e.g., second lateral surface 59) of first leadframe 50 which intersects first main surface 53 and first lateral surfaces 57 and 58. One or more first receiving portions (72, 74, 77) can align first leadframe 50 in the first direction (x direction) that is the longitudinal direction of first leadframe 50.

Particularly, protrusions 74 and 77 include first protrusion portions 75 and 78 facing first lateral surfaces 57 and 58 of first leadframe 50 and second protrusion portions 76 and 79 facing the surface (e.g., second lateral surface 59) of first leadframe 50 which intersects first main surface 53 and first lateral surfaces 57 and 58. Protrusion 74 includes a pair of first protrusion portions 75 and second protrusion portion 76. Second protrusion portion 76 is arranged apart from the pair of first protrusion portions 75. Protrusion 77 includes a pair of first protrusion portions 78 and second protrusion portion 79. Second protrusion portion 79 is arranged apart from the pair of first protrusion portions 78. Protrusions 74 and 77 may be walls or pillars.

Specifically, first protrusion portions 75 face first lateral surfaces 57 and 58 of first leadframe 50 at first end 55 of first leadframe 50. First protrusion portion 78 face first lateral surfaces 57 and 58 of first leadframe 50 at second end 56 of first leadframe 50. First protrusion portions 75 and 78 can align first leadframe 50 in the second direction (y direction) that is the transverse direction of first leadframe 50.

Second protrusion portions 76 and 79 face the surface (e.g., second lateral surface 59) of first leadframe 50 which intersects first main surface 53 and first lateral surfaces 57 and 58. Specifically, second protrusion portion 76 faces the surface (second lateral surface 59) of first leadframe 50 which intersects first main surface 53 and first lateral surfaces 57 and 58 at first end 55 of first leadframe 50. Second protrusion portion 79 faces the surface of first leadframe 50 which intersects first main surface 53 and first lateral surfaces 57 and 58 at second end 56 of first leadframe 50. Second protrusion portions 76 and 79 can align first leadframe 50 in the first direction (x direction) that is the longitudinal direction of first leadframe 50.

Power modules 1f to 1i according to first to fourth modifications of Embodiment 11 will be described with reference to FIGS. 30 to 33. Power modules 1f to 1i of the first to fourth modifications of the present embodiment differ from power module 1e of the present embodiment in the structure of protrusions 74 and 77.

Figure 30:
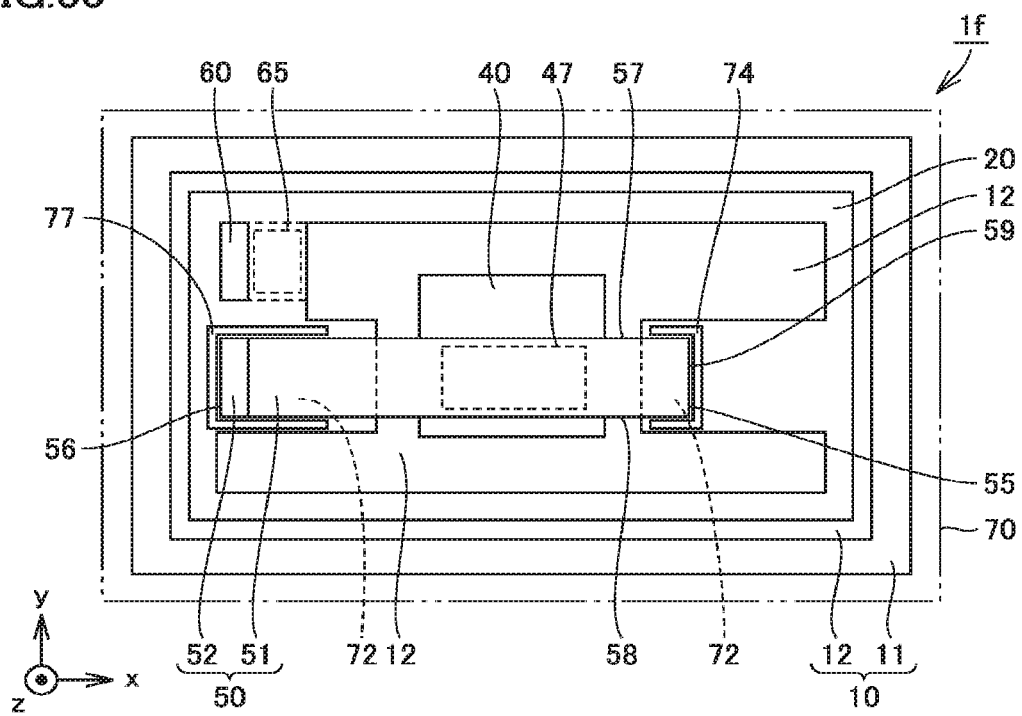
FIG. 30 is a schematic plan view of a power module according to a first modification of Embodiment 11 of the present invention.

In power module 1f of the first modification of the present embodiment shown in FIG. 30, one protrusion 74 faces first lateral surfaces 57 and 58 and the surface (second lateral surface 59) of first leadframe 50 which intersects first main surface 53 and first lateral surfaces 57 and 58 at first end 55 of first leadframe 50. Protrusion 74 can align first leadframe 50 in the longitudinal direction and transverse direction of first leadframe 50. In power module 1f of the first modification of the present embodiment, one protrusion 77 faces first lateral surfaces 57 and 58 and the surface of first leadframe 50 which intersects first main surface 53 and first lateral surfaces 57 and 58 at second end 56 of first leadframe 50. Protrusion 77 can align first leadframe 50 in the longitudinal direction and transverse direction of first leadframe 50.

Figure 31:
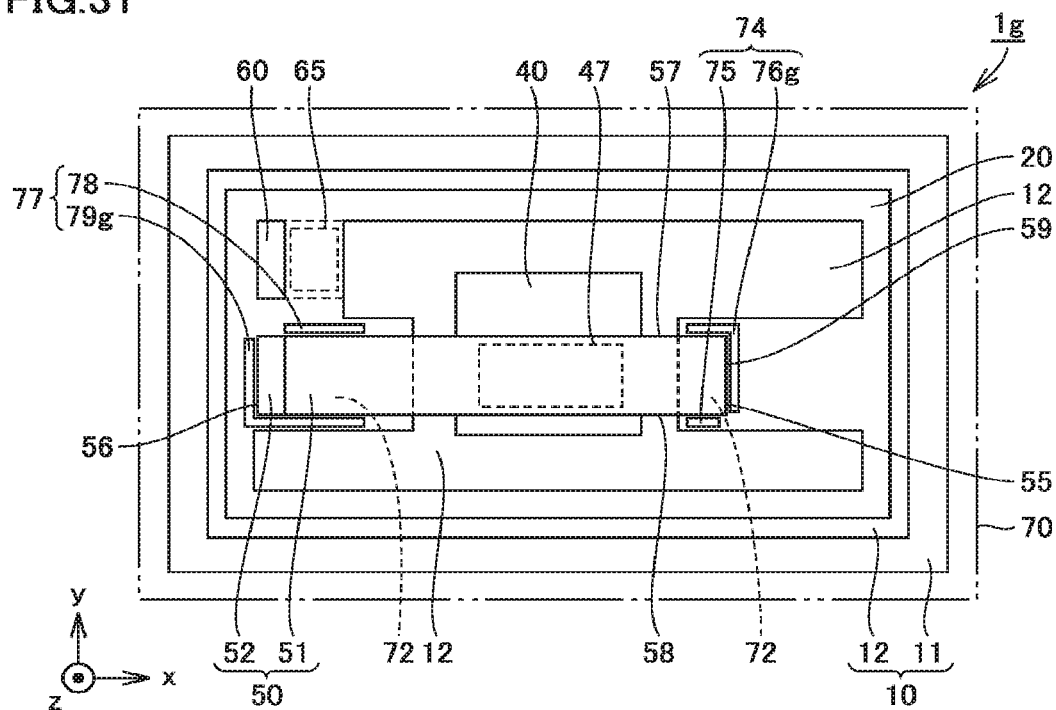
FIG. 31 is a schematic plan view of a power module according to a second modification of Embodiment 11 of the present invention.

In power module 1g of the second modification of the present embodiment shown in FIG. 31, protrusion 74 includes first protrusion portion 75 and a third protrusion portion 76g. First protrusion portion 75 faces first lateral surface 58 at first end 55 of first leadframe 50. First protrusion portion 75 can align first leadframe 50 in the transverse direction of first leadframe 50. Third protrusion portion 76g faces first lateral surface 57 and the surface (second lateral surface 59) of first leadframe 50 which intersects first main surface 53 and first lateral surfaces 57 and 58 at first end 55 of first leadframe 50. Third protrusion portion 76g can align first leadframe 50 in the longitudinal direction and transverse direction of first leadframe 50. In plan view of third main surface 72 of resin frame 20, third protrusion portion 76g may have an L shape. Third protrusion portion 76g is arranged apart from first protrusion portion 75.

In power module 1g of the second modification of the present embodiment, protrusion 77 includes first protrusion portion 78 and a third protrusion portion 79g. First protrusion portion 78 faces first lateral surface 57 at second end 56 of first leadframe 50. First protrusion portion 78 can align first leadframe 50 in the transverse direction of first leadframe 50. Third protrusion portion 79g faces first lateral surface 58 and the surface of first leadframe 50 which intersects first main surface 53 and first lateral surfaces 57 and 58 at second end 56 of first leadframe 50. Third protrusion portion 79g can align first leadframe 50 in the longitudinal direction and transverse direction of first leadframe 50. In plan view of third main surface 72 of resin frame 20, third protrusion portion 79g may have an L shape. Third protrusion portion 79g is arranged apart from first protrusion portion 78.

Figure 32:
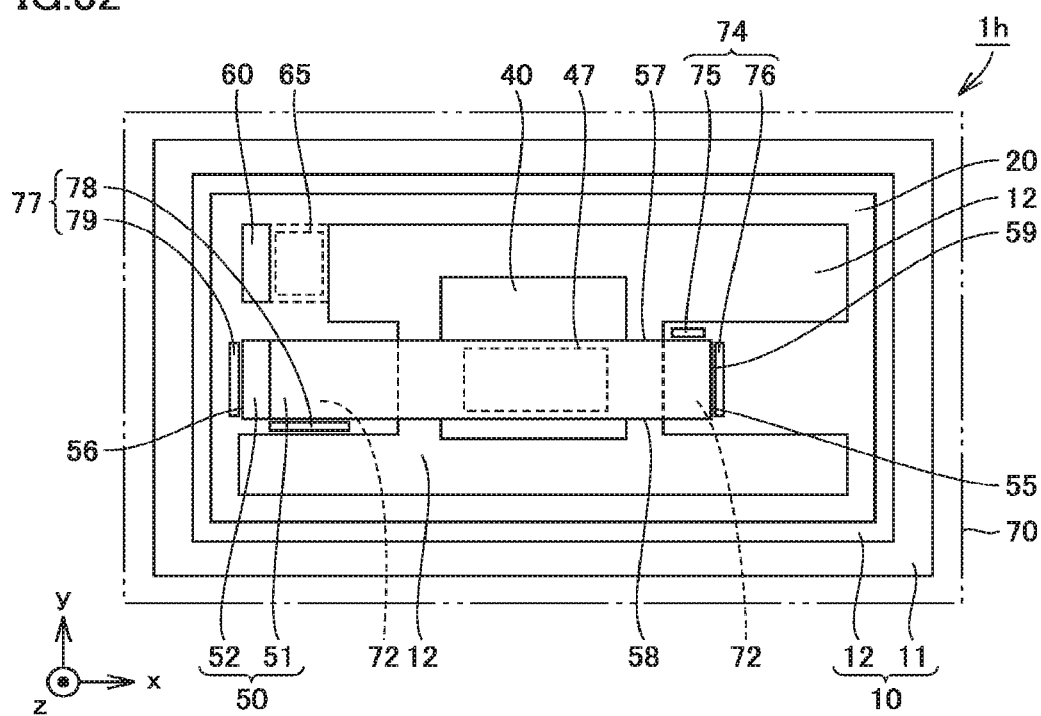
FIG. 32 is a schematic plan view of a power module according to a third modification of Embodiment 11 of the present invention.

In power module 1h of the third modification of the present embodiment shown in FIG. 32, protrusion 74 includes first protrusion portion 75 and second protrusion portion 76. First protrusion portion 75 faces first lateral surface 57 at first end 55 of first leadframe 50. First protrusion portion 75 can align first leadframe 50 in the transverse direction of first leadframe 50. Second protrusion portion 76 faces the surface (second lateral surface 59) of first leadframe 50 which intersects first main surface 53 and first lateral surfaces 57 and 58 at first end 55 of first leadframe 50. Second protrusion portion 76 can align first leadframe 50 in the longitudinal direction of first leadframe 50.

Second protrusion portion 76 is arranged apart from first protrusion portion 75. In power module 1h of the third modification of the present embodiment, protrusion 77 includes first protrusion portion 78 and second protrusion portion 79. First protrusion portion 78 faces first lateral surface 58 at second end 56 of first leadframe 50. First protrusion portion 78 can align first leadframe 50 in the transverse direction of first leadframe 50. Second protrusion portion 79 faces the surface of first leadframe 50 which intersects first main surface 53 and first lateral surfaces 57 and 58 at second end 56 of first leadframe 50. Second protrusion portion 79 can align first leadframe 50 in the longitudinal direction of first leadframe 50. Second protrusion portion 79 is arranged apart from first protrusion portion 78.

Figure 33:
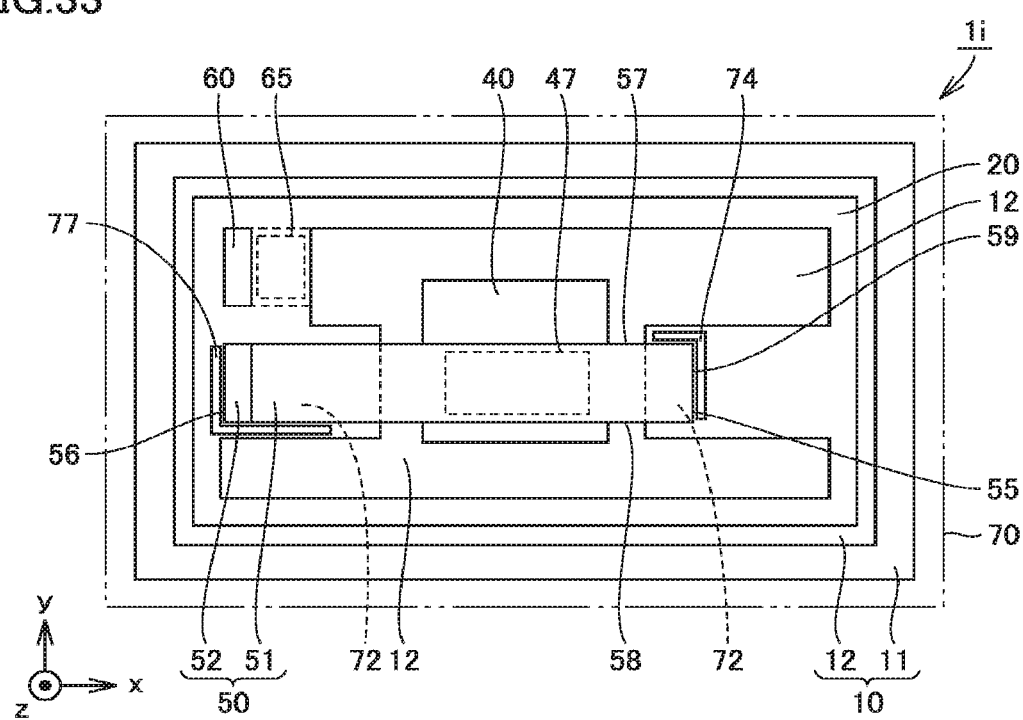
FIG. 33 is a schematic plan view of a power module according to a fourth modification of Embodiment 11 of the present invention.

In power module 1i of the fourth modification of the present embodiment shown in FIG. 33, one protrusion 74 faces first lateral surface 57 and the surface (second lateral surface 59) of first leadframe 50 which intersects first main surface 53 and first lateral surfaces 57 and 58 at first end 55 of first leadframe 50. Protrusion 74 can align first leadframe 50 in the longitudinal direction and transverse direction of first leadframe 50. In plan view of third main surface 72 of resin frame 20, protrusion 74 may have an L shape. In power module 1g of the second modification of the present embodiment, one protrusion 77 faces first lateral surface 58 and the surface of first leadframe 50 which intersects first main surface 53 and first lateral surfaces 57 and 58 at second end 56 of first leadframe 50. Protrusion 77 can align first leadframe 50 in the longitudinal direction and transverse direction of first leadframe 50. In plan view of third main surface 72 of resin frame 20, protrusion 77 may have an L shape.

In power modules 1e to 1i of the present embodiment and the first to fourth modifications thereof, the first receiving portions (72, 74, 77) include third main surface 72 of resin frame 20 facing first main surface 53, and protrusions 74 and 77 projecting from third main surface 72. Protrusions 74 and 77 face at least one of first lateral surfaces 57 and 58 of first leadframe 50 and the surface (e.g., second lateral surface 59) of first leadframe 50 which intersects first main surface 53 and first lateral surfaces 57 and 58. The effects of power modules 1e to 1i of the present embodiment and the first to fourth modifications thereof achieve effects similar to those of power module 1 of Embodiment 1.

It should be construed that the embodiments and the modifications thereof disclosed herein are given by way of illustration in all respects, not by way of limitation. At least two of Embodiment 1 to Embodiment 11 and the modifications thereof disclosed herein may be combined as long as there is no inconsistency. For example, in Embodiment 6 to Embodiment 10, the second receiving portions (124, 127) may include protrusions 74 and 77 disclosed in Embodiment 11 in place of second depressions 124 and 127. In Embodiment 10, the third receiving portion (204) may include protrusions 74 and 77 disclosed in Embodiment 11 in place of third depression 204. It is therefore intended that the scope of the present invention is defined by claims, not only by the embodiments described above, and encompasses all modifications and variations equivalent in meaning and scope to the claims.

REFERENCE SIGNS LIST

1, 1a, 1b, 1c, 1d, 1e, 1f, 1g, 1h, 1i, 2, 2a, 2b, 2c power module, 3, 3a power electronic apparatus, 10 first substrate, 11 first insulating plate, 12 first conductive portion, 13, 113 conductive portion, 14 second hole, 20, 20a, 20b, 20c, 20d, 20e, 20j first resin frame, 20e1 first resin frame portion, 20e2, 20j2 second resin frame portion, 24, 27 first depression, 25a first projection, 25b, 28b third projection, 28a, 29a second projection, 30 third recess, 35 metal film, 37 fourth projection, 38 locking portion, 39, 139 adhesive, 39c, 46, 146 solder, 40 first power semiconductor device, 43 second electrode, 44 first electrode, 47, 65, 147, 162, 165 conductive bonding member, 50, 50a, 50b, 50e, 50j first leadframe, 51, 51e, 51j first leadframe portion, 52 second leadframe portion, 53 first main surface, 55 first end, 55a first recess, 55b, 56b first hole, 56 second end, 57, 58 first lateral surface, 57a, 58a second recess, 59 second lateral surface, 60 second leadframe, 70 sealing resin body, 72 third main surface, 74, 77 protrusion, 75, 78 first protrusion portion, 76, 79 second protrusion portion, 76g, 79g third protrusion portion, 110 second substrate, 111 second insulating plate, 112 second conductive portion, 124, 127 second depression, 140 second power semiconductor device, 143 fourth electrode, 144 third electrode, 150 third leadframe, 153 second main surface, 155 third end, 156 fourth end, 157, 158 third lateral surface, 159 fourth lateral surface, 160 fourth leadframe, 175 insulating film, 200, 200j case, 201 radiating member, 202 radiating fin, 203, 203j tubular body, 204 third depression, 205a, 205b bonding member, 206 first bus bar, 207 second bus bar, 208 first connecting portion, 209 second connecting portion.

The invention claimed is:

1. A power module comprising:
a first substrate including a first conductive portion;
a first power semiconductor device including a first electrode and a second electrode, the second electrode electrically and mechanically connected to the first conductive portion;
a resin frame, at least a part of the resin frame being arranged on the first conductive portion so as to surround the first power semiconductor device;
a first leadframe electrically and mechanically connected to the first electrode, the first leadframe including a first main surface facing the first electrode and a first lateral surface intersecting the first main surface and extending in a longitudinal direction of the first leadframe; and
a second leadframe electrically and mechanically connected to the first conductive portion,
the resin frame including at least one first receiving portion facing the first main surface of the first leadframe,
the at least one first receiving portion receiving part of the first leadframe.

2. The power module according to claim 1, wherein the at least one first receiving portion is a depression formed in the resin frame facing the first main surface.

3. The power module according to claim 1, wherein
the at least one first receiving portion includes
a third main surface of the resin frame facing the first main surface, and
a protrusion projecting from the third main surface, and
the protrusion faces at least one of the first lateral surface and a second lateral surface of the first leadframe which intersects the first main surface and the first lateral surface.

4. The power module according to claim 1, wherein
the resin frame includes at least two first receiving portions facing the first main surface of the first leadframe,
the first receiving portions receive at least two ends of the first leadframe,
a first of the first receiving portions receives a first of the ends of the first leadframe, and
a second of the first receiving portions receives a second of the ends of the first leadframe.

5. The power module according to claim 4, wherein
when the first leadframe includes a first projection at the end, the resin frame includes a first recess in the first receiving portion,
when the first leadframe includes a first recess at the end, the resin frame includes a first projection in the first receiving portion, and
the first projection is fitted in the first recess.

6. The power module according to claim 1, wherein the at least one first receiving portion further faces the first lateral surface of the first leadframe.

7. The power module according to claim 6, wherein
when the first leadframe includes a second projection in the first lateral surface of the first leadframe, the resin frame includes a second recess in the first receiving portion,
when the first leadframe includes a second recess in the first lateral surface of the first leadframe, the resin frame includes a second projection in the first receiving portion, and
the second projection is fitted in the second recess.

8. The power module according to claim 1, wherein
when the first leadframe includes a third projection in the first main surface of the first leadframe, the resin frame includes a first hole in the first receiving portion,
when the resin frame includes a first hole in the first receiving portion, the resin frame includes a third projection in the first receiving portion, and
the third projection is fitted in the first hole.

9. The power module according to claim 1, wherein
the resin frame further includes a metal film arranged facing the first conductive portion, and
the resin frame is fixed to the first conductive portion via a solder bonded to the metal film.

10. The power module according to claim 1, wherein
when the first conductive portion includes a fourth projection, the resin frame includes a second hole,
when the first conductive portion includes a second hole, the resin frame includes a fourth projection, and
the fourth projection is fitted in the second hole.

11. The power module according to claim 1, wherein
the resin frame includes at least one locking portion, and the at least one locking portion is locked with the first conductive portion.

12. The power module according to claim 1, further comprising:
a second substrate including a second conductive portion;
a second power semiconductor device including a third electrode and a fourth electrode, the fourth electrode electrically and mechanically connected to the second conductive portion;
a third leadframe including a second main surface facing the third electrode, the third leadframe electrically and mechanically connected to the third electrode; and
a fourth leadframe electrically and mechanically connected to the second conductive portion, wherein
the fourth electrode is electrically and mechanically connected to the second conductive portion,
the resin frame is arranged on at least the second conductive portion so as to surround the second power semiconductor device,
the resin frame further includes at least one second receiving portion facing the second main surface of the third leadframe, and
the at least one second receiving portion receives part of the third leadframe.

13. The power module according to claim 12, further comprising an insulating film between the first leadframe and the third leadframe.

14. The power module according to claim 13, wherein the first leadframe and the third leadframe are integrated with each other by the insulating film.

15. The power module according to claim 1, further comprising:
a second power semiconductor device including a third electrode and a fourth electrode;
a third leadframe including a second main surface facing the third electrode, the third leadframe electrically and mechanically connected to the third electrode; and
a fourth leadframe, wherein
the first substrate further includes a second conductive portion,
the fourth leadframe is electrically and mechanically connected to the second conductive portion,
the fourth electrode is electrically and mechanically connected to the second conductive portion,
the resin frame is arranged on at least the first conductive portion so as to surround the second power semiconductor device,
the resin frame further includes at least one second receiving portion facing the second main surface of the third leadframe, and
the at least one second receiving portion receives part of the third leadframe.

16. A power electronic apparatus comprising:
a power module according to claim 1; and
a case accommodating the power module,
the case including a first bus bar and a second bus bar,
the first bus bar and the second bus bar electrically and mechanically connected to the first leadframe and the second leadframe, respectively.

17. The power electronic apparatus according to claim 16, wherein
the case includes a third receiving portion facing the first main surface of the first leadframe, and
the third receiving portion receives part of the first leadframe.

18. The power module according to claim 1, wherein
the resin frame seals a front surface of the first substrate, a side surface of the first substrate, the first power semiconductor device, the first receiving portion, a part of the first leadframe and a part of the second leadframe, and
a rear surface of the first substrate is exposed from the resin.

* * * * *